(12) United States Patent
Juco et al.

(10) Patent No.: US 10,991,550 B2
(45) Date of Patent: Apr. 27, 2021

(54) MODULAR RECIPE CONTROLLED CALIBRATION (MRCC) APPARATUS USED TO BALANCE PLASMA IN MULTIPLE STATION SYSTEM

(71) Applicant: Lam Research Corporation, Fremont, CA (US)

(72) Inventors: Eller Y. Juco, Tualatin, OR (US); Karl Frederick Leeser, West Linn, OR (US); David French, Portland, OR (US); Sunil Kapoor, Vancouver, WA (US); Aaron Bingham, Newberg, OR (US); David Alan Metz, McMinnville, OR (US); Brett Herzig, San Jose, CA (US); Jacob L. Hiester, Newberg, OR (US); Brian Knight, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/121,408

(22) Filed: Sep. 4, 2018

(65) Prior Publication Data
US 2020/0075289 A1 Mar. 5, 2020

(51) Int. Cl.
*H01J 37/32* (2006.01)
*H01L 21/687* (2006.01)

(52) U.S. Cl.
CPC ...... *H01J 37/32091* (2013.01); *H01J 37/321* (2013.01); *H01J 37/32183* (2013.01); *H01L 21/68785* (2013.01)

(58) Field of Classification Search
None
See application file for complete search history.

(56) References Cited

U.S. PATENT DOCUMENTS

| | | | | |
|---|---|---|---|---|
| 8,742,665 B2* | 6/2014 | Lubomirsky | ........ | H01J 37/3211 |
| | | | | 315/111.01 |
| 9,236,892 B2* | 1/2016 | Dupuy | ..................... | H01Q 3/24 |

(Continued)

FOREIGN PATENT DOCUMENTS

| | | |
|---|---|---|
| JP | 2005-101943 A | 4/2005 |
| KR | 10-2010-0041248 A | 4/2010 |

(Continued)

OTHER PUBLICATIONS

Intl Search Report and Written Opinion PCT/US2019/048658, dated Dec. 16, 2019, 17 pages.

*Primary Examiner* — Amy Cohen Johnson
*Assistant Examiner* — Srinivas Sathiraju
(74) *Attorney, Agent, or Firm* — Penilla IP, APC

(57) ABSTRACT

A circuit tuning radio frequency (RF) power. The circuit includes a low to mid frequency (LF/HF) tuning circuit including a variable LF/MF capacitor coupled in series with an LF/MF inductor. The LF/MF tuning circuit is coupled between ground and a common node configured to receive an RF input. The circuit includes a high frequency (HF) tuning circuit coupled in parallel to the LF/MF tuning circuit between ground and the common node. The HF tuning circuit includes a variable HF capacitor coupled in series with an HF inductor. Cross parallel isolation occurs between the LF/MF inductor of the LF/MF tuning circuit and the HF inductor of the HF tuning circuit when adjusting the variable LF/MF capacitor or variable HF capacitor.

7 Claims, 14 Drawing Sheets

(56) References Cited

U.S. PATENT DOCUMENTS

| | | | | |
|---|---|---|---|---|
| 9,536,749 | B2* | 1/2017 | Marakhtanov | H01J 37/32146 |
| 9,595,424 | B2* | 3/2017 | Marakhtanov | H01J 37/3255 |
| 9,773,643 | B1* | 9/2017 | Singhal | C23C 16/045 |
| 9,872,373 | B1* | 1/2018 | Shimizu | H05H 1/46 |
| 9,984,859 | B2* | 5/2018 | Marakhtanov | H01J 37/32183 |
| 10,217,608 | B2* | 2/2019 | Mavretic | H01L 21/31116 |
| 10,269,540 | B1* | 4/2019 | Carter | H01J 37/32091 |
| 10,283,330 | B2* | 5/2019 | Marakhtanov | H01J 37/3299 |
| 10,304,663 | B1* | 5/2019 | Kapoor | H01L 21/67201 |
| 10,325,759 | B2* | 6/2019 | Valcore, Jr. | H01J 37/32119 |
| 10,340,879 | B2* | 7/2019 | Mavretic | H02M 1/08 |
| 10,373,804 | B2* | 8/2019 | Koh | H01J 37/32697 |
| 10,396,601 | B2* | 8/2019 | Luu | H02J 50/20 |
| 10,431,424 | B2* | 10/2019 | Mavretic | H01L 29/2003 |
| 10,546,724 | B2* | 1/2020 | Radomski | H01J 37/321 |
| 2011/0299632 | A1* | 12/2011 | Mirzaei | H03F 3/45179 375/340 |
| 2014/0305589 | A1* | 10/2014 | Valcore, Jr. | H01J 37/32183 156/345.24 |
| 2015/0031313 | A1* | 1/2015 | Murphy | H03B 5/1228 455/77 |
| 2015/0109072 | A1* | 4/2015 | Bakalski | H03H 11/04 333/174 |
| 2016/0260584 | A1* | 9/2016 | Marakhtanov | H01J 37/32568 |
| 2016/0293385 | A1* | 10/2016 | Kapoor | H01L 21/02274 |
| 2016/0343548 | A1* | 11/2016 | Howald | G01R 27/28 |
| 2017/0084429 | A1* | 3/2017 | Marakhtanov | H01J 37/32183 |
| 2017/0084432 | A1 | 3/2017 | Valcore, Jr. et al. | |
| 2017/0111025 | A1* | 4/2017 | Kapoor | H03H 1/0007 |
| 2017/0169995 | A1* | 6/2017 | Kim | H01J 37/32009 |
| 2017/0187337 | A1* | 6/2017 | Dupuy | H03F 3/21 |
| 2017/0365907 | A1* | 12/2017 | Kapoor | C23C 16/505 |
| 2018/0252783 | A1* | 9/2018 | Jones | G01R 33/3614 |
| 2020/0075289 | A1* | 3/2020 | Juco | H01J 37/321 |

FOREIGN PATENT DOCUMENTS

| | | |
|---|---|---|
| KR | 10-2010-0078589 A | 7/2010 |
| KR | 10-2013-0014455 A | 2/2013 |

* cited by examiner

MODULAR RECIPE CONTROLLED CALIBRATION (MRCC) APPARATUS USED TO BALANCE PLASMA IN MULTIPLE STATION SYSTEM

TECHNICAL FIELD

The present embodiments relate to semiconductor substrate processing equipment tools, and more particularly, a modular recipe controlled calibration (MRCC) apparatus used to balance plasma throughout multiple stations in a semiconductor processing system.

BACKGROUND OF THE DISCLOSURE

In multi-station semiconductor processing systems including those performing deposition, input RF power is split and distributed to the multiple stations. In particular, the input RF power is split using one module or box for all the stations. That is, after splitting the RF power, no feasible tuning is available on a station-by-station basis. With the use of a single control box, it is infeasible to control the RF power delivered to each station to achieve any desired power distribution (balanced or unbalanced).

In addition, the real estate inside the module used for splitting the RF power may be limited, wherein the module splits and distributes the input RF power to multiple stations. This may be problematic as clearance and creepage limits increasingly become harder to meet, thereby introducing a risk of arcing within the internal circuity.

Further, current technology uses series elements to adjust tune the output RF power, as supplied through a low to mid frequency RF power and/or a high frequency RF power. However, because of the nature of the topology, when tuning the output RF power there is no isolation between the circuit elements used for tuning. That is, tuning the low to mid frequency RF power will have an effect on the high frequency RF power, and vice versa tuning the high frequency RF power will have an effect on the low to mid frequency RF power. To accommodate for the lack of isolation may require additional circuit elements. However, this would require an increase in the volume of the module used for splitting the RF power, which is not always possible. Also, the additional circuit may create a risk of very high voltages, because of the series resonance.

In addition, current technology implements the manual tuning of capacitive elements within the module used for splitting the RF power, wherein the module splits and distributes the input RF power to multiple stations. However, once the capacitive element is set, the capacitor position (and value) is not further monitored. That is, there is no active tuning of the RF power once the capacitive element is set. Further, when communication is cut from the system or power cycle, the last capacitor position is not known.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure It is in this context that embodiments of the disclosure arise.

SUMMARY

The present embodiments relate to solving one or more problems found in the related art, and specifically to provide recipe-controlled radio frequency (RF) power adjustment to each station of a processing chamber in a modular manner Several inventive embodiments of the present disclosure are described below.

Embodiments of the present disclosure include a circuit tuning RF power. The circuit includes a low frequency (LF) to mid-frequency (MF) tuning circuit including a variable LF/MF capacitor coupled in series with an LF/MF inductor. The LF/MF tuning circuit is configured to operate between approximately 5 kHz (kilohertz) to 400 kHz over a low frequency range, and between 300 kHz to over 3 MHz (megahertz) over a mid-frequency range. The LF/MF tuning circuit is coupled between ground and a common node configured to receive an RF input. The circuit includes a high frequency (HF) tuning circuit coupled in parallel to the LF/MF tuning circuit between ground and the common node. The HF tuning circuit including a variable HF capacitor coupled in series with an HF inductor. The HF tuning circuit is isolated from the LF/MF tuning circuit when adjusting the variable LF/MF capacitor. In addition, the LF/MF tuning circuit is isolated from the HF tuning circuit when adjusting the variable HF capacitor. That is, cross parallel isolation occurs between the LF/MF inductor of the LF/MF tuning circuit and the HF inductor of the HF tuning circuit when adjusting the variable LF/MF capacitor or variable HF capacitor.

Other embodiments of the present disclosure include an apparatus for tuning RF power. The apparatus includes an RF dual source power generator including an LF/MF power generator providing LF/MF power at a low to mid frequency, and an HF power generator providing HF power at a high frequency. For example, the LF/MF power generator is configured to operate between approximately 5 kHz (kilohertz) to 400 kHz over a low frequency range, and/or between 300 kHz to over 3 MHz (megahertz) over a mid-frequency range depending on its configuration. The apparatus includes a split input RF (SIRF) distribution box configured for receiving the LF/MF power and for receiving the HF power. The SIRF distribution box is further configured for combining and distributing at least one of the LF/MF power and the HF power as one or more split RF inputs. The apparatus includes one or more modular remote controlled calibration (MRCC) circuits for one or more processing stations. Each MRCC circuit includes an LF/MF tuning circuit coupled in parallel to an HF tuning circuit between ground and a corresponding common node configured to receive a corresponding split RF input. The LF/MF tuning circuit includes a variable LF/MF capacitor coupled in series with an LF/MF inductor, wherein the LF/MF tuning circuit is coupled between ground and the corresponding common node. The HF tuning circuit includes a variable HF capacitor coupled in series with an HF inductor, wherein the HF tuning circuit is coupled between ground and the corresponding common node. The corresponding common node is configured to provide a corresponding RF output to a corresponding station after tuning. Cross parallel isolation occurs between the LF/MF inductor of the LF/MF tuning circuit and the HF inductor of the HF tuning circuit when adjusting the variable LF/MF capacitor or variable HF capacitor.

Another embodiment of the present disclosure includes an assembly for use in a process chamber for depositing a film on a wafer. The assembly includes an RF dual source power generator including an LF/MF power generator providing LF/MF power at a low to mid frequency, and an HF power generator providing HF power at a high frequency. For example, the LF/MF power generator is configured to operate between approximately 5 kHz (kilohertz) to 400 kHz over a low frequency range, and/or between 300 kHz to over 3 MHz (megahertz) over a mid-frequency range depending on its configuration. The assembly includes a split input RF (SIRF) distribution box configured for receiving the LF/MF power and for receiving the HF power. The SIRF distribution box is further configured for combining and distributing at least one of the LF/MF power and the HF power as a first split RF input, a second split RF input, a third split RF input, and a fourth split RF input. The assembly includes four MRCC circuits, including a first MRCC circuit for a first processing station, a second MRCC circuit for a second processing station, a third MRCC circuit for a third processing station; and a fourth MRCC circuit for a fourth processing station. Each MRCC circuit includes an LF/MF tuning circuit coupled in parallel to an HF tuning circuit between ground and a corresponding common node configured to receive a corresponding split RF input. The LF/MF tuning circuit includes a variable LF/MF capacitor coupled in series with an LF/MF inductor, wherein the LF/MF tuning circuit is coupled between ground and the corresponding common node. The HF tuning circuit includes a variable HF capacitor coupled in series with an HF inductor, wherein the HF tuning circuit is coupled between ground and the corresponding common node. The corresponding common node is configured to provide a corresponding RF output to a corresponding station after tuning. Cross parallel isolation occurs between the LF/MF inductor of the LF/MF tuning circuit and the HF inductor of the HF tuning circuit when adjusting the variable LF/MF capacitor or variable HF capacitor.

These and other advantages will be appreciated by those skilled in the art upon reading the entire specification and the claims.

BRIEF DESCRIPTION OF THE DRAWINGS

The embodiments may best be understood by reference to the following description taken in conjunction with the accompanying drawings.

FIG. 5A-1 illustrates cross parallel isolation between the LF/MF tuning circuit and the HF tuning circuit of the MRCC diagram of FIG. 5A, in accordance with one embodiment of the present disclosure.

DETAILED DESCRIPTION

Figure 1A:
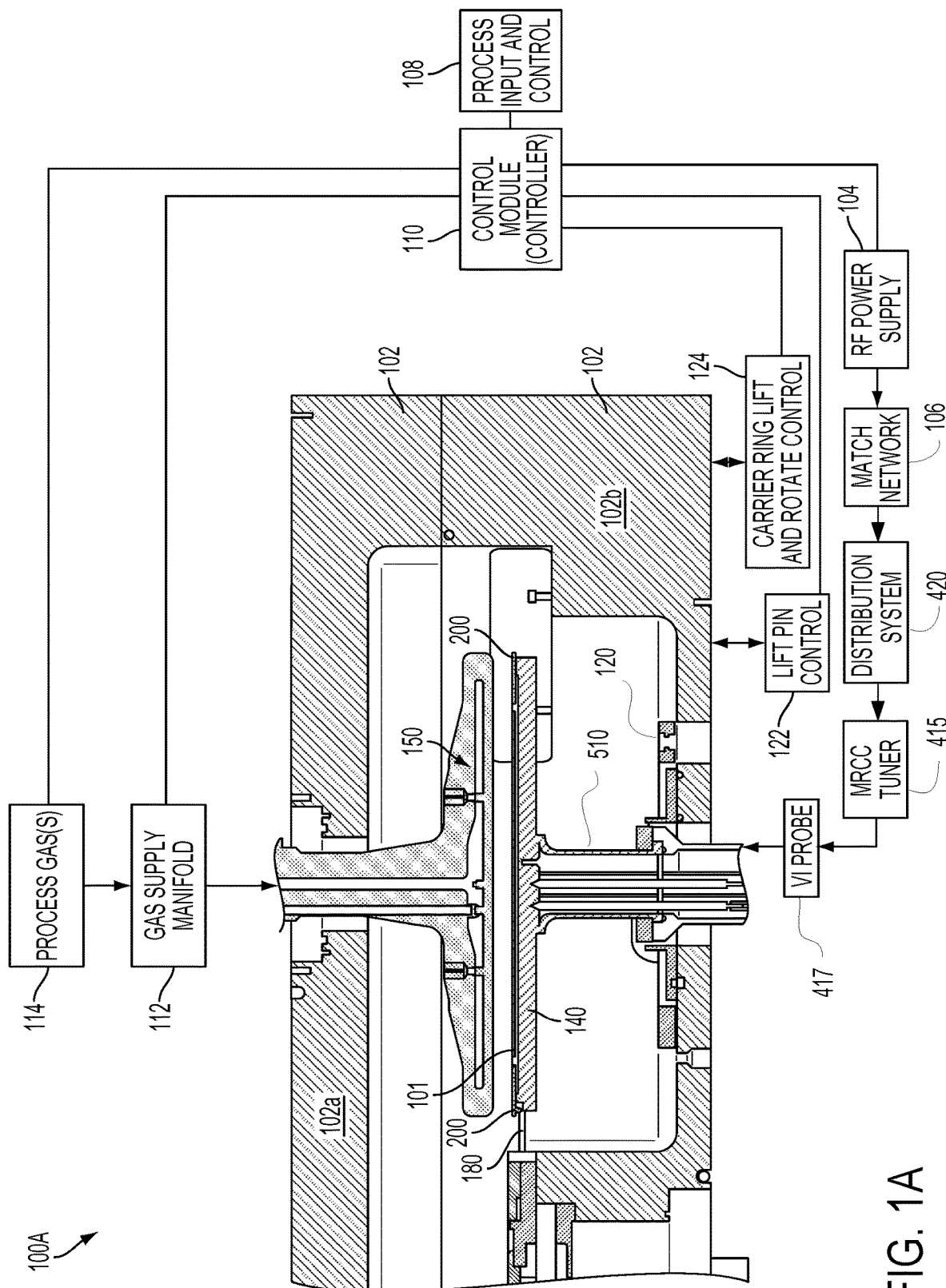
FIG. 1A illustrates a substrate processing system illustrating the application of RF power to a pedestal, which is used to process a wafer, e.g., to form films thereon, in accordance with one embodiment of the present disclosure.

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

Generally speaking, the various embodiments of the present disclosure describe systems and methods that provide for balanced distribution of RF power to multiple stations. In particular, plasma enhanced chemical vapor deposition (PECVD) multi-station plasma modules uses RF energy to either deposit or etch film to the wafer (e.g., 300 mm wafer, etc.). Each station is sourced with either high frequency only or combined high frequency and low to mid frequency energy, or a combination thereof. Because of the nature of plasma, its impedance is dynamic, hence active tuning of the RF power to a station is necessary to balance the RF power delivered to the plasma. That is, the impedance of the plasma (acting as a load) has an effect on the delivery of the RF power. In embodiments, a modular remote controlled calibration (MRCC) system achieves balanced distribution of RF power to each of the stations in a multi-station plasma system.

Advantages of the RF power delivery system of embodiments of the disclosure include a modular approach to the delivery and adjusting of RF power to each station of a multi-station processing system. Splitting input RF power from an RF power source for delivery to multiple stations does not provide balanced power, as the impedance of the plasma at a particular station is continually changing. By providing RF power tuning ability at each station (e.g., through an MRCC circuit/module of embodiments), power delivery can be increased or decreased as desired. As such, individual control of power and/or voltage to each station is provided. In addition, embodiments of the present disclosure provide isolation of the RF power adjustment when adjusting either the LF/MF or HF frequency. In particular, the MRCC module uses two parallel circuits to change the impedance of the load (e.g., plasma)—one for low to mid frequency adjusting and one for high frequency adjusting. These parallel circuits are designed so that when one frequency is adjusted, the other frequency will not be affected. Further, embodiments of the present disclosure use absolute encoders to track down the position of each capacitor. In that manner, position information for a capacitor is not lost. In addition, embodiments of the present disclosure use a clamshell design for the MRCC module that allows an assembler to gain access to internal componentry on three sides of the module. This allows for shorter assembly time, and lessens the cost of construction. Further, embodiments of the present disclosure use a floating motor mount to counter axial misalignment between the capacitor and the actuator turning the capacitor. This prevents the capacitor from seizing due to misalignment.

With the above general understanding of the various embodiments, example details of the embodiments will now be described with reference to the various drawings. Similarly numbered elements and/or components in one or more figures are intended to generally have the same configuration and/or functionality. Further, figures may not be drawn to scale but are intended to illustrate and emphasize novel concepts. It will be apparent, that the present embodiments may be practiced without some or all of these specific details. In other instances, well-known process operations have not been described in detail in order not to unnecessarily obscure the present embodiments.

Embodiments of the present disclosure relate to power delivery in plasma process modules, such as those used in plasma enhanced chemical vapor deposition (PECVD) and atomic layer deposition (ALD) processes. Embodiments of the present disclosure may be implemented in various process module configurations. Further, embodiments of the present disclosure are not limited to the examples provided herein, and may be practiced in different plasma processing systems employing different configurations, geometries, and plasma-generating technologies (e.g., inductively coupled systems, capacitively coupled systems, electron-cyclotron resonance systems, microwave systems, etc.). Examples of plasma processing systems and plasma process modules are disclosed in commonly owned U.S. Pat. Nos. 8,862,855, and 8,847,495, and 8,485,128, and U.S. patent application Ser. No. 15/369,110.

FIG. 1A illustrates a reactor system 100A, which may be used to deposit films over substrates, such as those formed in CVD (e.g., PECVD) or atomic layer deposition (ALD) processes. Deposition of films is preferably implemented in a PECVD system. As shown in the configuration of FIG. 1A, RF power is delivered to the pedestal 140, though in other embodiments power may be delivered in other ways, such as through a showerhead. These reactors may utilize two or more heaters, and the common terminal configurations may be used in this example reactor to control the temperatures for uniformity or custom settings. More particularly, FIG. 1A illustrates a substrate processing system 100A, which is used to process a wafer 101. The system includes a chamber 102 having a lower chamber portion 102b and an upper chamber portion 102a. A center column is configured to support a pedestal 140, which in one embodiment is a powered electrode. The pedestal 140 is electrically coupled to RF power supply 104 via a match network 106. The power supply is controlled by a control module 110, e.g., a controller. The control module 110 is configured to operate the substrate processing system 100A by executing process input and control 108. The process input and control 108 may include process recipes, such as power levels, timing parameters, process gasses, mechanical movement of the wafer 101, etc., such as to deposit or form films over the wafer 101.

The substrate processing system 100A may include multiple processing stations. For example, chamber 102 may include multiple processing stations, each station having a pedestal for supporting a wafer 101. The RF power and frequency supplied by matching network 106 is split and distributed by the distribution system 420. To adjust the amount of RF power delivered to each station, one or more MRCC tuners 415 are provided in a one-to-one relationship between an MRCC tuner 415 and a station. For example, the one or more MRCC tuners 415 can be configured to provide balanced tuning between each of the stations such that each station receives an equal amount of RF power, in one embodiment. In another embodiment, the one or more MRCC tuners 415 can be configured to provide desired RF powers to each of the stations, such that power delivered to each of the stations need not necessarily be equal.

One method includes calibrating a system with known good components and systems. Using the voltage probe (e.g., VI probe 417) feedback is provided back to the corresponding MRCC tuner (e.g., tuner 415) to determine how to adjust the RF power delivery to a corresponding station. For example, one VI probe 417 is used to determine current and voltage for a corresponding station. As such, during operation, the VI probe 107 can measure voltage variations due to the change in impedance of the plasma, and can actively adjust the RF power to achieve the desired delivery of RF power to a station during processing.

The center column also includes lift pins (not shown), each of which is actuated by a corresponding lift pin actuation ring 120 as controlled by lift pin control 122. The lift pins are used to raise the wafer 101 from the pedestal 140 to allow an end-effector to pick the wafer and to lower the wafer 101 after being placed by the end-effector. The substrate processing system 100A further includes a gas supply manifold 112 that is connected to process gases 114, e.g., gas chemistry supplies from a facility. Depending on the processing being performed, the control module 110 controls the delivery of process gases 114 via the gas supply manifold 112. The chosen gases are then flown into the shower head 150 and distributed in a space volume defined between the showerhead 150 face that faces that wafer 101 and the wafer 101 resting over the pedestal 140. In ALD processes, the gases can be reactants chosen for absorption or reaction with absorbed reactants.

Further, the gases may be premixed or not. Appropriate valving and mass flow control mechanisms may be employed to ensure that the correct gases are delivered during the deposition and plasma treatment phases of the process. Process gases exit chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is a carrier ring 200 that encircles an outer region of the pedestal 140. The carrier ring 200 is configured to sit over a carrier ring support region that is a step down from a wafer support region in the center of the pedestal 140. The carrier ring includes an outer edge side of its disk structure, e.g., outer radius, and a wafer edge side of its disk structure, e.g., inner radius, that is closest to where the wafer 101 sits. The wafer edge side of the carrier ring includes a plurality of contact support structures which are configured to lift the wafer 101 when the carrier ring 200 is lifted by spider forks 180. The carrier ring 200 is therefore lifted along with the wafer 101 and can be rotated to another station, e.g., in a multi-station system. In other embodiments, the chamber is a single station chamber.

Figure 1B:
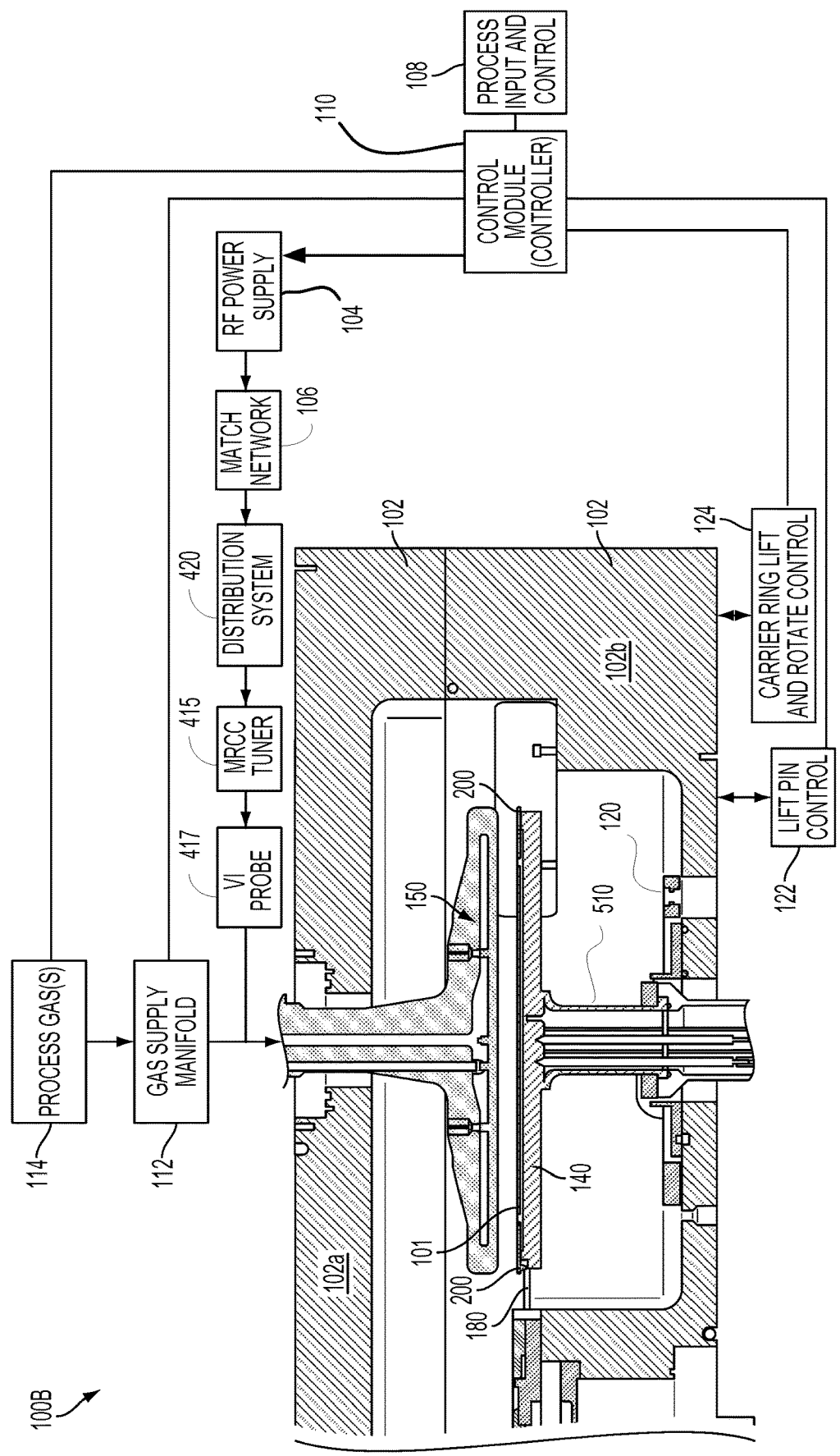
FIG. 1B illustrates a substrate processing system illustrating the application of RF power to a showerhead, which is used to process a wafer, e.g., to form films thereon, in accordance with one embodiment of the present disclosure.

FIG. 1B illustrates a substrate processing system 100B illustrating the application of RF power to a showerhead, which is used to process a wafer, e.g., to form films thereon, in accordance with one embodiment of the present disclosure. Reactor system 100B may be used to deposit films over substrates, such as those formed in CVD (e.g., PECVD) or atomic layer deposition (ALD) processes. As shown in the configuration of FIG. 1B, RF power is delivered to the showerhead 150, though in other embodiments power may be delivered in other ways, such as through the pedestal 140 as in FIG. 1A.

Substrate processing system 100B is similar to system 100A, except for the location of the delivery of the RF power. Like numbered elements perform similar functions and have similar configurations. For example, system 100B includes a chamber 102 having a lower chamber portion 102b and an upper chamber portion 102a. A center column is configured to support a pedestal 140, which in one embodiment is a grounded electrode.

A showerhead 150 is electrically coupled to a power supply (e.g., one or more RF power generators 50) via an RF match network 106. The power supply is controlled by a control module 110, e.g., a controller. The control module 110 is configured to operate the substrate processing system 100A by executing process input and control 108, as previously described. Depending on the processing being performed, the control module 110 controls the delivery of process gasses 114 via the gas supply manifold 112. The chosen gasses are then flown into the shower head 150 and distributed in a space volume defined between a showerhead face that faces the wafer 101 and the wafer resting over pedestal 140.

The substrate processing system 100B may include multiple processing stations. For example, chamber 102 may include multiple processing stations, each station having a pedestal for supporting a wafer 101. The RF match network 106 may be coupled to an RF distribution system 420 that supplies power to the system 100B. For example, the RF power and frequency supplied by matching network 106 is split and distributed by the distribution system 420 to each of the stations. Also, the RF power being delivered to a station is passed through a VI probe 417 for sensing a voltage of the showerhead, during operation. In that manner, the RF power may be adjusted at each station for balanced power delivery, or for desired power delivery.

To adjust the amount of RF power delivered to each station, one or more MRCC tuners 415 are provided in a one-to-one relationship between an MRCC tuner 415 and a station. For example, the one or more MRCC tuners 415 can be configured to provide balanced tuning between each of the stations such that each station receives an equal amount of RF power, in one embodiment. In another embodiment, the one or more MRCC tuners 415 can be configured to provide desired RF powers to each of the stations, such that power delivered to each of the stations need not necessarily be equal.

Figure 2:
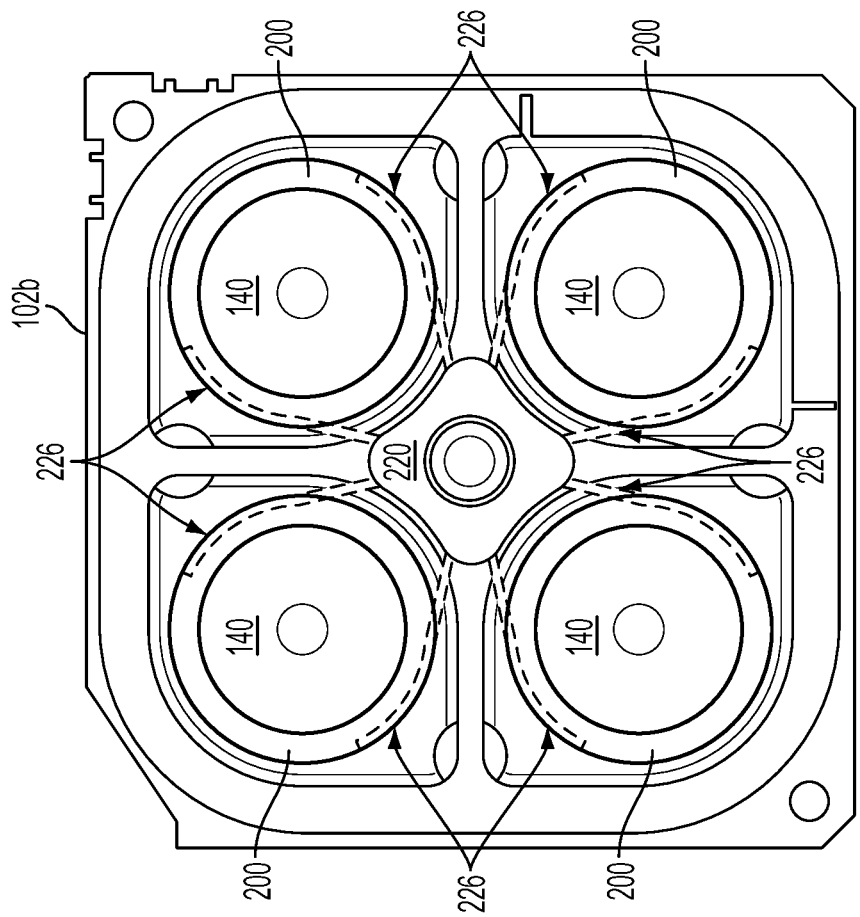
FIG. 2 illustrates a top view of a multi-station processing tool, wherein four processing stations are provided, in accordance with one embodiment of the present disclosure.

FIG. 2 illustrates a top view of a multi-station processing tool, wherein four processing stations are provided. This top view is of the lower chamber portion 102b (e.g., with the top chamber portion 102a removed for illustration), wherein four stations are accessed by spider forks 226. Each spider fork, or fork includes a first and second arm, each of which is positioned around a portion of each side of the pedestal 140. In this view, the spider forks 226 are drawn in dash-lines, to convey that they are below the carrier ring 200. The spider forks 226, using an engagement and rotation mechanism 220 are configured to raise up and lift the carrier rings 200 (i.e., from a lower surface of the carrier rings 200) from the stations simultaneously, and then rotate at least one or more stations before lowering the carrier rings 200 (where at least one of the carrier rings supports a wafer 101) to a next location so that further plasma processing, treatment and/or film deposition can take place on respective wafers 101.

Figure 3:
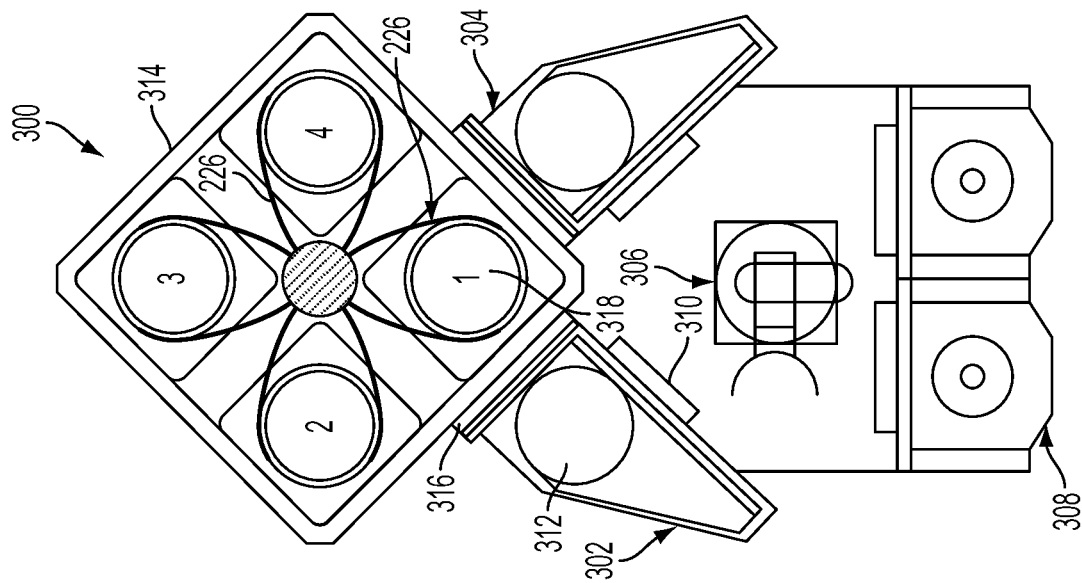
FIG. 3 shows a schematic view of an embodiment of a multi-station processing tool with an inbound load lock and an outbound load lock, in accordance with one embodiment of the present disclosure.

FIG. 3 shows a schematic view of an embodiment of a multi-station processing tool 300 with an inbound load lock 302 and an outbound load lock 304. A robot 306, at atmospheric pressure, is configured to move substrates from a cassette loaded through a pod 308 into inbound load lock 302 via an atmospheric port 310. Inbound load lock 302 is coupled to a vacuum source (not shown) so that, when atmospheric port 310 is closed, inbound load lock 302 may be pumped down. Inbound load lock 302 also includes a chamber transport port 316 interfaced with processing chamber 102b. Thus, when chamber transport 316 is opened, another robot (not shown) may move the substrate from inbound load lock 302 to a pedestal 140 of a first process station for processing.

The depicted processing chamber 102b comprises four process stations, numbered from 1 to 4 in the embodiment shown in FIG. 3. In some embodiments, processing chamber 102b may be configured to maintain a low pressure environment so that substrates may be transferred using a carrier ring 200 among the process stations without experiencing a vacuum break and/or air exposure. Each process station depicted in FIG. 3 includes a process station substrate holder (shown at 318 for station 1) and process gas delivery line inlets.

FIG. 3 also depicts spider forks 226 for transferring substrates within processing chamber 102b. The spider forks 226 rotate and enable transfer of wafers from one station to another. The transfer occurs by enabling the spider forks 226 to lift carrier rings 200 from an outer undersurface, which lifts the wafer, and rotates the wafer and carrier together to the next station. In one configuration, the spider forks 226 are made from a ceramic material to withstand high levels of heat during processing.

Figure 4A:
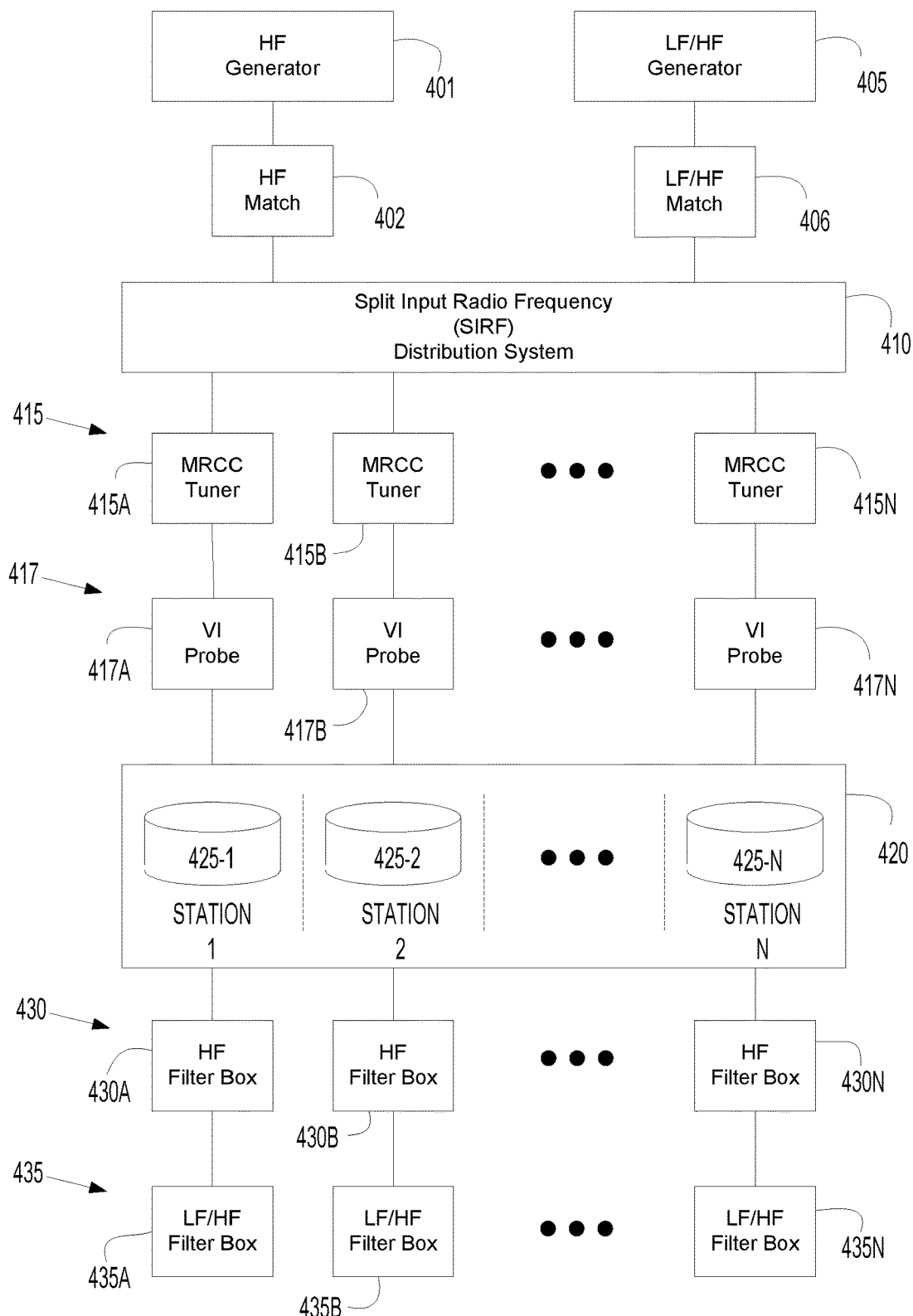
FIG. 4A illustrates an exemplary chemical vapor deposition (CVD) system configured for automatic balancing of the distribution of RF power to multiple stations, in accordance with one embodiment of the present disclosure.

FIG. 4A illustrates an exemplary multi-station plasma system 400A (e.g., chemical vapor deposition system) configured for desired distribution (e.g., automatic balancing, weighted distribution, etc.) of RF power to multiple stations, in accordance with one embodiment of the present disclosure. A PECVD multi-station plasma system uses RF energy to either deposit or etch film to one or more wafers.

For example, the multi-station plasma system 400A provides for active tuning of RF power for each station to balance the distribution between the plasma reactors (known to be dynamic) of each station. As shown, the multi-station plasma system 400 includes an RF generator system including an HF generator 401 for generating high frequency RF power and an LF/MF generator 405 for generating low to mid frequency RF power. The high frequency power is operating at a high frequency (e.g., approximately 13.56 MHz, a range between 10-20 MHz, range between 5-50 MHz, range between 5-100 MHz). The low frequency power is operating a low frequency (e.g., ranging between 360 kHz to 440 kHz, ranging between 200 kHz to 700 kHz, and ranging between 100 kHz to 900 kHz). The mid-frequency power is operating at a mid-frequency (e.g., ranging between 200 kHz to 500 kHz, ranging between 400 kHz to 800 kHz, ranging between 500 kHz to 1 MHz, ranging between 800 kHz to 2 MHz, and ranging between 1.5 MHz to 3.5 MHz). Each generator is split into multiple distribution channels, wherein each channel powers a plasma reactor (e.g., station). The power consumption at each station depends on each reactor's condition (e.g., the plasma impedance which is dynamic). For example, the high frequency RF generator 401 is connected to a matching network 402. The power and frequency supplied by the matching network 402 is delivered to the split input radio frequency (SIRF) distribution system 410. Also, the low to mid frequency RF generator 405 is connected to a matching network 406. The power and frequency supplied by the matching network 406 is delivered to the SIRF distribution system 410.

The SIRF distribution system 410 splits and distributes each of the high frequency RF power and the low to mid frequency RF power to the channels (e.g., 1 through N channels). Each station can be sourced with either high frequency RF power only, low to mid frequency RF power only, or a combination of high frequency and low to mid frequency RF powers. In one embodiment, the RF power output of the SIRF distribution system 410 is equally distributed to each of the channels.

Each channel powers a capacitively coupled plasma (CCP) reactor as shown in FIG. 4A. For example, a first channel powers a reactor enclosing pedestal 425-1 of station 1, a second channel powers a reactor enclosing pedestal 425-2 of station 2, . . . and a Nth channel powers a reactor enclosing pedestal 425-N of station N. The power consumption depends on the reactor condition of a corresponding station. Since CCP reactors are known to be dynamic, embodiments of the present disclosure provide for active tuning of the RF power to each station in order to balance the distribution between the reactors, or to provide desired power levels to each station. In particular, each channel includes an MRCC channel configured for tuning the RF power delivered through a corresponding channel to a corresponding station. Further, each channel includes a VI probe 417 for measuring voltage of the RF power being delivered to a corresponding station. That voltage may be used as feedback to determine the proper voltage and/or power delivered to a station. That is, by connecting an MRCC tuner to a corresponding VI probe, and with sufficient logic, multi-station RF auto-matching may be performed to actively balance station power, in one embodiment. Also, instead of a balanced distribution, a desired and/or calibrated imbalance may also be achieved. For example, in the first channel VI probe 417A is configured to measure the RF power delivered by the MRCC tuner 415A to station 1, in the second channel VI probe 417B is configured to measure the RF power delivered by MRCC tuner 415B to station 2, . . . and in the Nth channel VI probe 417N is configured to measure the RF power delivered by the MRCC tuner 415N to station N.

As shown in FIG. 4A, each station is configured with one or more filter boxes. In general, power sources that provide alternating current (AC) or direct current (DC) power to various components through a center column of a pedestal (e.g., heater and controllers that receive voltage signals from thermocouples to measure temperature of the heater, etc.) are protected from RF power also delivered through the center column by using the filter boxes (e.g., RF filters) at points before and after portions of the channels that combine RF power (low to mid frequency and/or high frequency) with AC or DC power. For example, when high frequency RF power is delivered to a station (e.g., delivered to a chuck through a center column of a pedestal), a high frequency filter box 430 is also provided to isolate the high frequency RF power from any other electrical circuitry also present in the center column. For example, AC or DC path lines that also travel through the center column of the pedestal may be used to control heating elements within the chuck of the pedestal. As such, the high frequency filter box 430 isolates the AC path lines from the high frequency RF power delivered through the center column. Similarly, a low to mid frequency filter box 435 isolates the AC path lines from a low to mid frequency RF power delivered through the center column More particularly, a high frequency filter box 430A isolates high frequency RF power and low to mid frequency filter box 435A isolates low to mid frequency RF power delivered to station 1; a high frequency filter box 430B isolates high frequency RF power and low to mid frequency filter box 435B isolates low to mid frequency RF power delivered to station 2; . . . and a high frequency filter box 430N isolates high frequency RF power and low to mid frequency filter box 435N isolates low to mid frequency RF power delivered to station N.

Figure 4B:
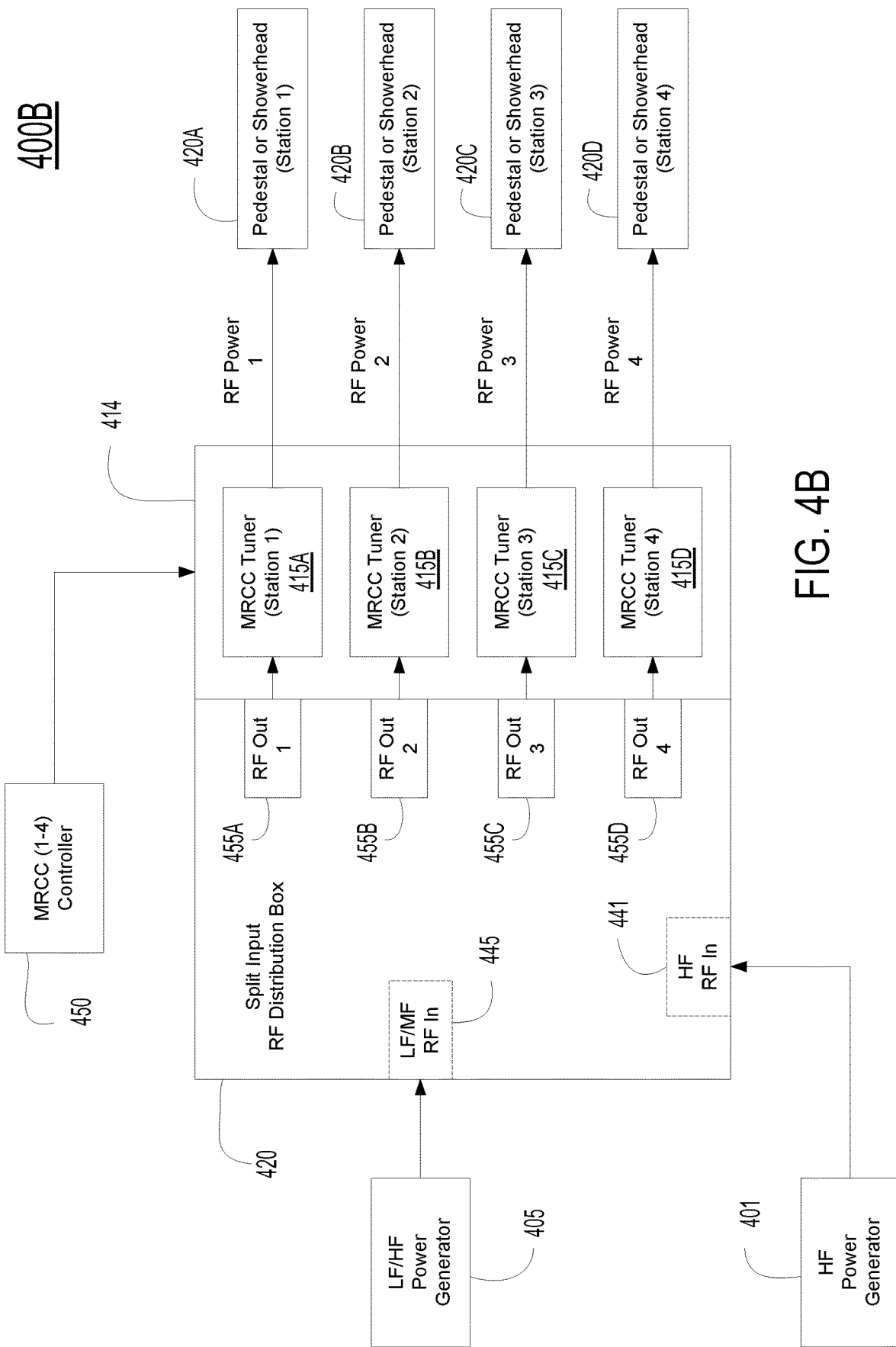
FIG. 4B illustrates the automatic balancing of the distribution of RF power to multiple stations using one or more modular remote controlled calibration (MRCC) systems, in accordance with one embodiment.

FIG. 4B illustrates a block diagram of an RF power system 400B configured for automatic balancing of the distribution of RF power, or desired or weighted distribution of RF power, to a quad station module (QSM) plasma processing system using one or more MRCC systems, in accordance with one embodiment. System 400B can be implemented within the multi-station plasma system 400A of FIG. 4A.

Multiple power generators are provided. For example, an RF dual source power generator may include a low to mid frequency RF power generator 405 providing LF/HF power, and a high frequency RF power generator 401 providing HF power at a high frequency.

In addition, a split input RF (SIRF) distribution box 420 is configured for receiving the LF/MF power from the low to mid frequency RF power generator 405 and for receiving the HF power from the high frequency RF power generator 401. The SIRF distribution box 420 is further configured for combining and distributing at least one of the LF/MF power and the HF power as one or more split RF outputs, each of which is provided to a corresponding MRCC module 415 as a corresponding split RF input. For example, SIRF distribution box 420 provides RF output 1 (455A) to MRCC tuner 415A providing adjusted RF power to station 1, and provides RF output 2 (455B) to MRCC tuner 415B providing adjusted RF power to station 2, provides RF output 3 (455C) to MRCC tuner 415C providing adjusted RF power to station 3, and provides RF output 4 (455D) to MRCC tuner 415D providing adjusted RF power to station 4.

As such, the four MRCC tuners of the RF power system 400B provides as internal RF inputs the RF powers (e.g., RF outputs) from the SIRF distribution box 420, such that each MRCC tuner 415 has an RF input and an RF output. That is, each MRCC tuner has an RF input that is connected to the SIRF RF output for a corresponding station. Also, each MRCC tuner has one RF output that is provided to a station, either a pedestal or a showerhead. For example, MRCC tuner 415A provides tuned RF power 1 to pedestal or showerhead 420A of station 1, MRCC tuner 415B provides tuned RF power 2 to pedestal or showerhead 420B of station 2, MRCC tuner 415C provides tuned RF power 3 to pedestal or showerhead 420C of station 3, and MRCC tuner 415D provides tuned RF power 4 to pedestal or showerhead 420D of station 4. In one embodiment, the RF power delivered to each station is balanced and/or approximately equal). In another embodiment, the RF power delivered to each station is imbalanced according to a desired distribution.

In addition, MRCC controller 450 controls operations of each of the MRCC tuners 415A-415D (e.g., provides setting for balanced distribution, manual distribution, described distribution, etc.). For example, MRCC controller 450 may provide control signals for adjusting a value of a corresponding variable capacitor, wherein by tuning the variable capacitor, RF power output of a corresponding MRCC tuner can be adjusted.

In particular, each MRCC tuner 415 includes an RF circuit with two parallel circuit paths, as described below in FIG. 5A. Each parallel circuit path includes a series resonant circuit with resonance that is above the fundamental frequency of operation, either LF/MF or HF. Further, both parallel circuits are designed to adjust the power of either LF/MF or HF by adjusting the value of the variable capacitors respectively. The power response to the adjustment is dependent on the plasma load impedance of the station.

Figure 5A:
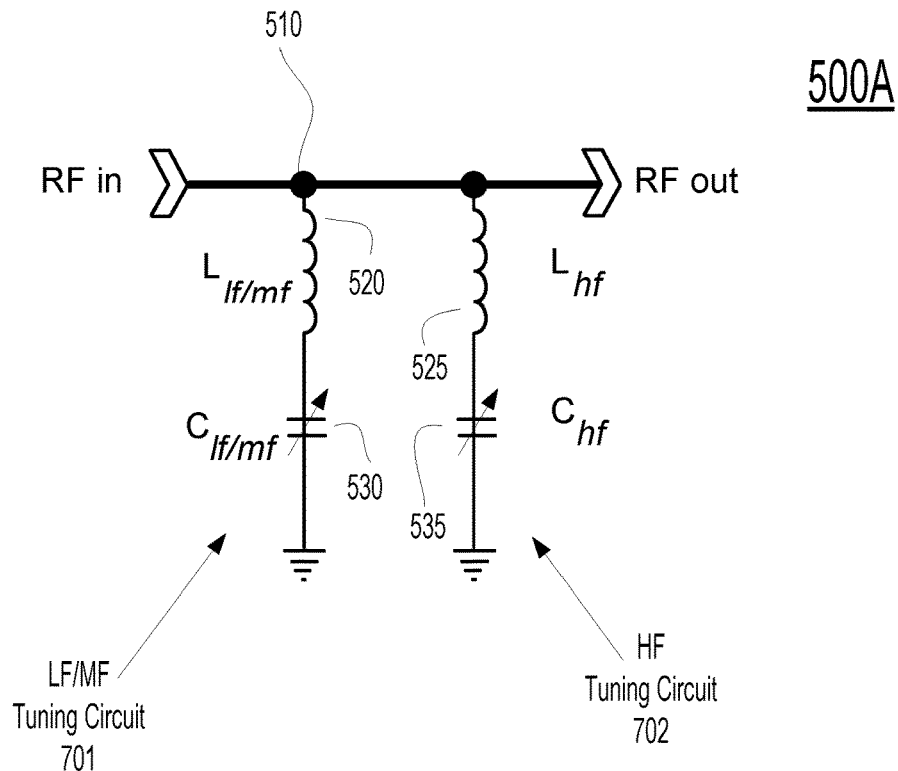
FIG. 5A is an MRCC circuit diagram configured for automatic tuning of RF power, wherein the MRCC circuit includes a low to mid frequency tuning circuit and a high frequency tuning circuit, in accordance with one embodiment of the present disclosure.

FIG. 5A is an MRCC circuit diagram 500A configured for automatic tuning of RF power, wherein the MRCC circuit includes a low to mid frequency tuning circuit and a high frequency tuning circuit, in accordance with one embodiment of the present disclosure. MRCC circuit diagram 500A has a wide capacitance range that provides a large tuning range with minimal high frequency and low to mid frequency cross-talk. As shown, the MRCC circuit 500A includes an LF/MF tuning circuit 701 coupled in parallel to an HF tuning circuit 702 between ground and a corresponding common node 510 that is configured to provide a corresponding split RF input (e.g., receives split RF output from the SIRF distribution box 420, that is then internally provided as an RF input). The parallel circuits when tuned change the impedance of the load. In particular, inserting the MRCC circuit diagram 500A into the RF path impedes the load by increasing or decreasing the energy and/or power going to a corresponding station. Further, the LF/MF tuning circuit 701 and the HF tuning circuit 702 are designed such that when one is adjusted, the other circuit is not affected.

The LF/MF tuning circuit 701 includes a variable LF/MF capacitor 530 that is coupled in series with an LF/MF inductor 520. The LF/MF tuning circuit is coupled between ground and the corresponding common node 510. In one embodiment, the resonance of the LF/MF tuning circuit 701 is above the fundamental frequency of operation (LF/MF frequency). In one embodiment, the variable LF/MF capacitor 530 has a value between 5-700 picofarads (pf), though in other embodiments the value may exceed the range. In one embodiment, the variable LF/MF capacitor 530 has a value between 15-650 picofarads (pf), though in other embodiments the value may exceed the range. In one embodiment, the variable LF/MF capacitor 530 has a value between 100-400 picofarads (pf), though in other embodiments the value may exceed the range. In one embodiment, the variable LF/MF capacitor 530 has a value between 200-300 picofarads (pf), though in other embodiments the value may exceed the range. The LF/MF tuning circuit 701 is tuned and/or adjusted by varying the value of the LF/MF capacitor 530. As such, LF/MF power is adjusted by adjusting the value of the variable LF/MF capacitor 530. In one embodiment, the LF/MF inductor 520 has a value found within a range between 10 and 40 microhenrys (uH). In one embodiment, the LF/MF inductor 520 has a value of 24 microhenrys (uH), though in other embodiments, the value may be different.

The HF tuning circuit 702 includes a variable HF capacitor 535 that is coupled in series with an HF inductor 525. The HF tuning circuit 702 is coupled between ground and the corresponding common node. In one embodiment, the resonance of the HF tuning circuit 702 is above the fundamental frequency of operation (HF frequency). In one embodiment, the variable HF capacitor 535 has a value between 2-75 picofarads (pf), though in other embodiments the value may exceed the range. In one embodiment, the variable HF capacitor 535 has a value between 5-50 picofarads (pf), though in other embodiments the value may exceed the range. In one embodiment, the variable HF capacitor 535 has a value between 10-30 picofarads (pf), though in other embodiments the value may exceed the range. In one embodiment, the variable HF capacitor 535 has a value between 15-25 picofarads (pf), though in other embodiments the value may exceed the range. The HF tuning circuit 702 is tuned and/or adjusted by varying the value of the HF capacitor 535. As such, HF power is adjusted by adjusting the value of the variable HF capacitor 535. In one embodiment, the HF inductor 525 has a value found within a range between 3 and 30 microhenrys (uH). In one embodiment, the HF inductor 525 has a value found within a range between 5 and 25 microhenrys (uH). In one embodiment, the HF inductor 525 has a value of 16 microhenrys (uH), though in other embodiments, the value may be different. In one embodiment, the value of the HF inductor 525 is smaller than the value of the LF/MF inductor 520.

As previously described, the LF/MF tuning circuit 701 is tuned and/or adjusted by varying the value of the LF/MF capacitor 530, and the HF tuning circuit 702 is tuned and/or adjusted by varying the value of the HF capacitor 535. The required values of the LF/MF capacitor 530 and the high frequency capacitor 535 are dependent on the process conditions in the reactor. For example, tuning of the LF/MF tuning circuit 701 and/or HF tuning circuit 702 provides for tuning of the voltage presented to the corresponding reactor and/or tuning of the power delivered to the corresponding reactor. Specifically, the MRCC circuit diagram 500A uses multiple parallel circuits (e.g., the LF/MF tuning circuit 701 and the HF tuning circuit 702) as a phase shifter to provide an impedance change for a specific source frequency. As such, a change in impedance will change the power delivered to the particular load (station). In that manner, as the load changes (e.g., the plasma dynamically changes its impedance during processing) the MRCC circuit is configured to automatically adjust its impedance to deliver the proper power to the load (e.g., balanced power, desired power, etc.). Furthermore, in embodiments, the values of the LF/MF capacitor 530 and HF capacitor 535 are synchronized with changes in process conditions either through one tuning for an entire processing sequence or through tuning at multiple critical steps within a processing sequence.

After tuning the MRCC circuit diagram 500A, the corresponding common node 510 is configured to provide a corresponding RF output to a corresponding station. That is, the RF input is now adjusted and provided as an RF output to the corresponding station.

In embodiments, the LF/MF tuning circuit 701 and the HF tuning circuit 702 are designed to have isolation to avoid interference between their respective source frequencies. In addition, these circuits avoid resonance through its adjustment range to prevent drastic increase in current to one station. Below is the impedance equation of a MRCC circuit diagram 500A.

$$zMRCC(f) = \frac{\left[\left(\frac{1}{\omega(f) \times C_{LF}} + \omega(f) \times L_{LF}\right) \times \left(\frac{1}{\omega(f) \times C_{HF}} + \omega(f) \times L_{HF}\right)\right]}{\left[\left(\frac{1}{\omega(f) \times C_{LF}} + \omega(f) \times L_{LF}\right) + \left(\frac{1}{\omega(f) \times C_{HF}} + \omega(f) \times L_{HF}\right)\right]} \quad (1)$$

Figures 1, 5A:
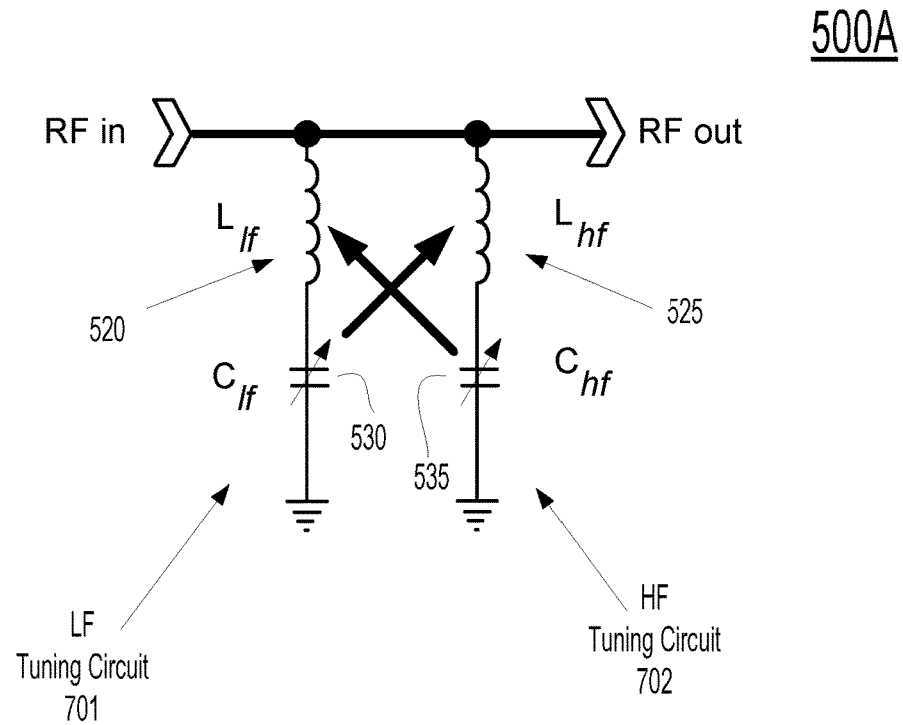

FIG. 5A-1 illustrates cross parallel isolation between the LF/MF tuning circuit and the HF tuning circuit of the MRCC diagram of FIG. 5A, in accordance with one embodiment of the present disclosure. In particular, the HF tuning circuit is isolated from the LF/MF tuning circuit when adjusting the variable LF/MF capacitor. Also, the LF/MF tuning circuit is isolated from the HF tuning circuit when adjusting the variable HF capacitor. Specifically, cross parallel isolation occurs between the LF/MF inductor of the LF/MF tuning circuit and the HF inductor of the HF tuning circuit when adjusting the variable LF/MF capacitor or variable HF capacitor. As shown, when the LF/MF capacitor 530 is adjusted, the HF inductor 525 in the parallel circuit for the HF tuning circuit 702 operates to present a high impedance, thereby isolating the HF tuning circuit 702 when the LF/MF tuning circuit 701 (e.g., the LF/MF capacitor 530) is being adjusted. Also, when the HF capacitor 535 is adjusted, the LF/MF inductor 520 in the parallel circuit for the LF/MF tuning circuit 701 operates to present a high impedance, thereby isolating the LF/MF tuning circuit 701 when the HF tuning circuit 702 (e.g., the HF capacitor 535) is being adjusted. That is, each of the low to mid frequency and high frequency inductors provide cross parallel isolation when adjusting the opposing capacitor of the opposing or cross tuning circuit.

Figure 5C:
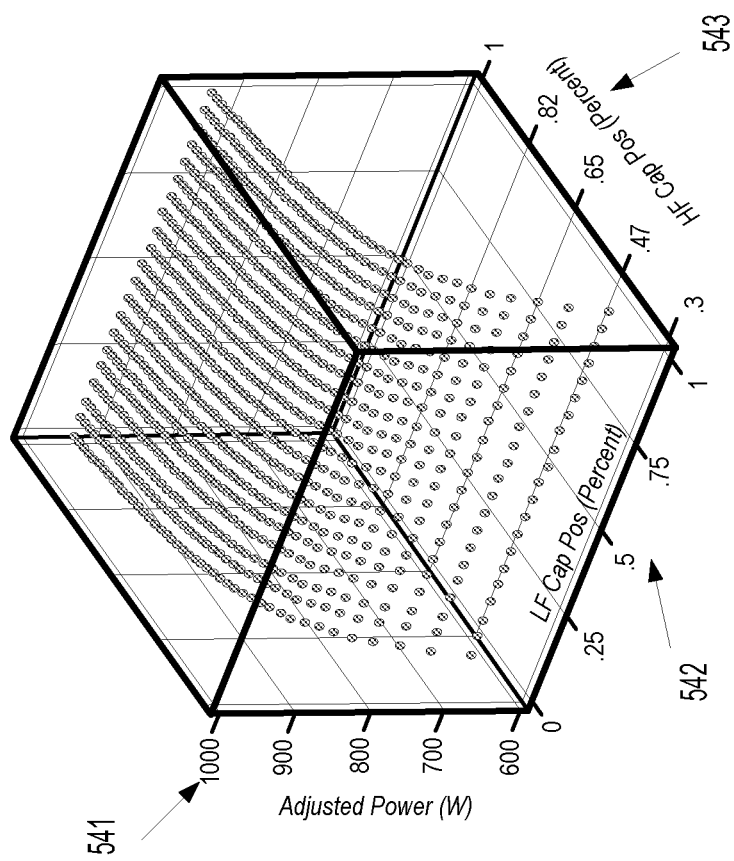
FIG. 5C illustrates a 3D graph showing tuning of RF power using an MRCC circuit by adjusting a capacitor of a high frequency tuning circuit that is independent of the value of a capacitor of a low to mid frequency tuning circuit of a MRCC circuit configured for automatic balancing of the distribution of RF power to multiple stations, in accordance with one embodiment of the present disclosure.
Figure 5B:
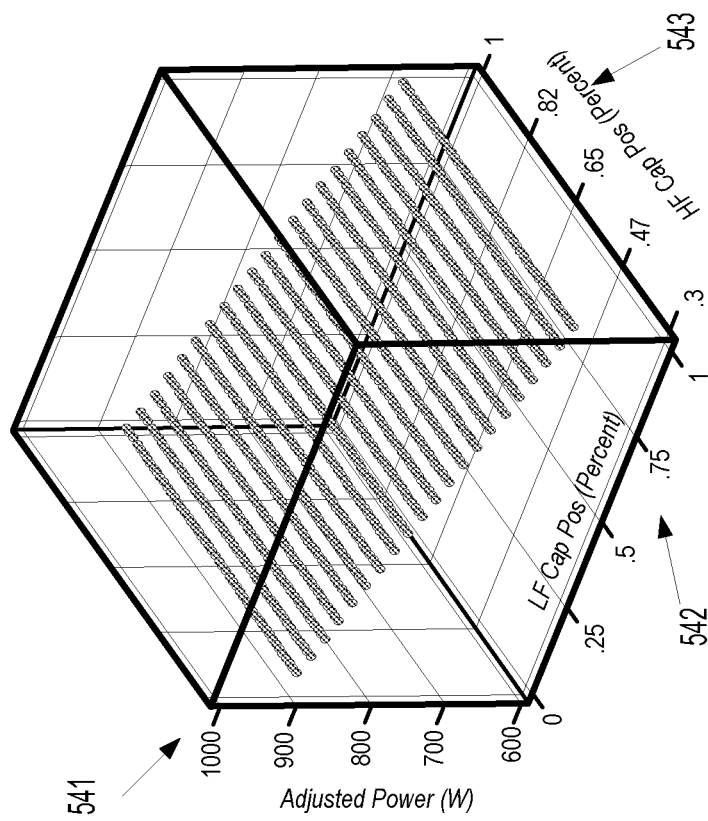
FIG. 5B illustrates a three-dimensional (3D) graph showing tuning of RF power using an MRCC circuit by adjusting a capacitor of a low to mid frequency tuning circuit that is independent of the value of a capacitor of a high frequency tuning circuit of a MRCC circuit configured for automatic balancing of the distribution of RF power to multiple stations, in accordance with one embodiment of the present disclosure.

FIGS. 5B and 5C illustrate examples of adjusting power using the MRCC circuit diagram 500A with a 1 KW input power (e.g., internal RF input). As described, power is adjusted through varying one or more of the LF/MF capacitor 530 and HF capacitor 535. In FIGS. 5B and 5C, the values of the LF/MF capacitor 530 and HF capacitor 535 are expressed as range percentages of total available values for capacitance. In particular, FIGS. 5B and 5C show simulation results using 13.56 MHz for the high frequency and 400 kHz as the low to mid frequency, with a 1 kW input power. As shown, FIGS. 5B and 5C demonstrate the adjustability and isolation between the circuits for each frequency.

In particular, FIG. 5B illustrates a three-dimensional (3D) graph 500B showing tuning of RF power using an MRCC circuit by adjusting a capacitor of a low to mid frequency tuning circuit (e.g., LF/MF capacitor 530 of LF/MF tuning circuit 701) that is independent of the value of a capacitor of a high frequency tuning circuit (e.g., HF capacitor 535 of HF tuning circuit 702) of a MRCC circuit configured for automatic balancing of the distribution of RF power to multiple stations or a desired distribution of RF power, in accordance with one embodiment of the present disclosure. Graph 500B includes a Z-axis 541 showing power, an X-axis 542 showing the value of the LF/MF capacitor 530, and a Y-axis 542 showing the value of the HF capacitor 535. In particular, isolation between the LF/MF tuning circuit 701 and the HF tuning circuit 702 is achieved when tuning the MRCC circuit diagram 500A. In one embodiment, the HF tuning circuit 702 is isolated from the LF/MF tuning circuit 701 when adjusting the variable LF/MF capacitor 530. For example, when a corresponding split RF input has a low to mid frequency component (e.g., low to mid frequency of 400 kHz), the HF inductor 525 presents a high impedance to the corresponding split RF input effectively isolating the HF tuning circuit 702 from the LF/MF tuning circuit 701 when adjusting the variable LF/MF capacitor 530. As shown, for a particular value of the LF/MF capacitor 530, the power level is constant no matter the value of the HF capacitor 543. That is, even though the HF capacitor 543 may change in value for a particular value of the LF/MF capacitor 530, the power level is constant.

FIG. 5C illustrates a 3D graph 500C showing tuning of RF power using an MRCC circuit by adjusting a capacitor of a high frequency tuning circuit that is independent of the value of a capacitor of a low to mid frequency tuning circuit of a MRCC circuit configured for automatic balancing of the distribution of RF power to multiple stations, in accordance with one embodiment of the present disclosure. Graph 500C includes the same axis as graph 500B of FIG. 5B, and includes a Z-axis 541 showing power, an X-axis 542 showing the value of the LF/MF capacitor 530, and a Y-axis 542 showing the value of the HF capacitor 535. In particular, isolation between the LF/MF tuning circuit 701 and the HF tuning circuit 702 is achieved when tuning the MRCC circuit diagram 500A, for example. In one embodiment, the LF/MF tuning circuit 701 is isolated from the HF tuning circuit 702 when adjusting the variable HF capacitor 535. For example, when a corresponding split RF input has a high frequency component (e.g., high frequency of 13.56 MHz), the LF/MF inductor 520 presents a high impedance to the corresponding split RF input effectively isolating the LF/MF tuning circuit 701 from the HF tuning circuit 702 when adjusting the variable HF capacitor 535. As shown, for a particular value of the HF capacitor 535, the power level is constant no matter the value of the LF/MF capacitor 530. That is, even though the LF/MF capacitor 530 may change in value for a particular value of the HF capacitor 535, the power level is constant.

Figure 5D:
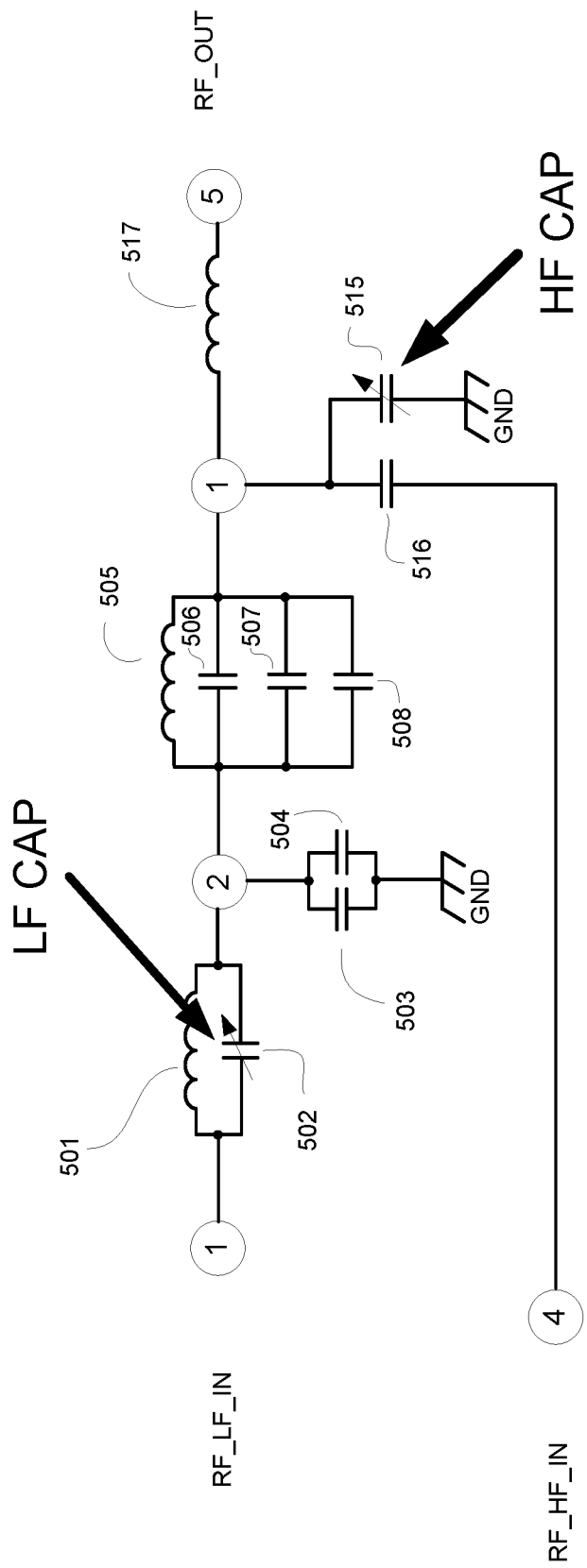
FIG. 5D illustrates a recipe controlled calibration system including series elements for splitting the RF power delivered to multiple stations, in accordance with one embodiment of the present disclosure.
Figure 5F:
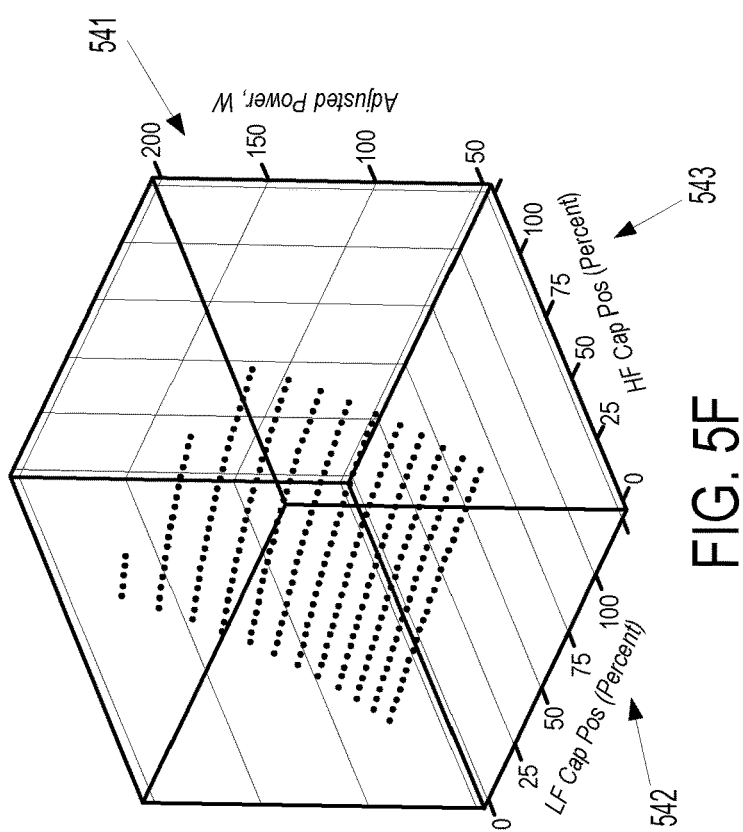
FIG. 5F illustrates a 3D graph showing tuning of RF power using the recipe controlled calibration system of FIG. 5D that shows the effect on a low to mid frequency tuning circuit when adjusting a high frequency tuning circuit, in accordance with one embodiment of the present disclosure.
Figure 5E:
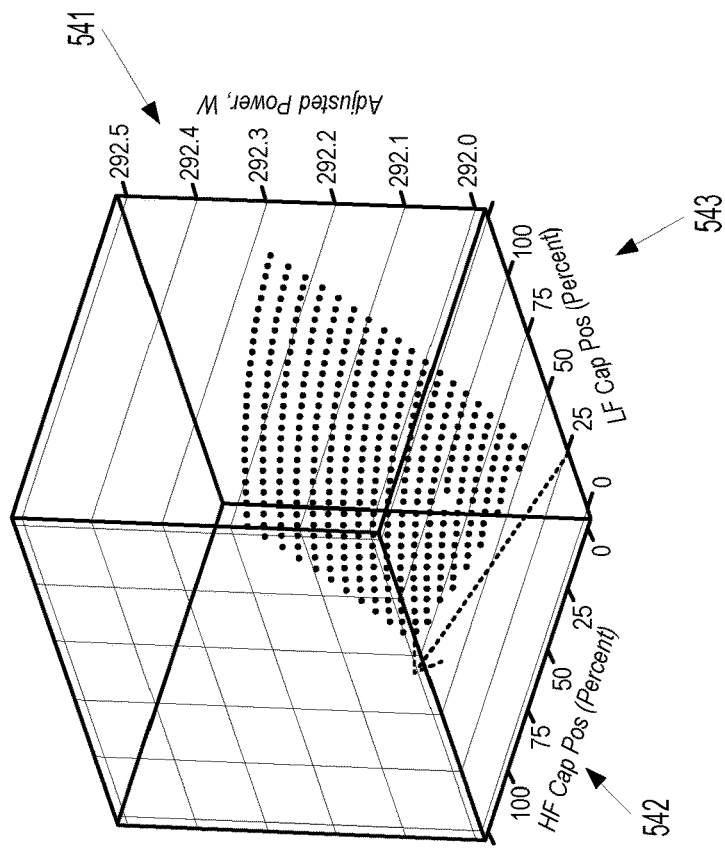
FIG. 5E illustrates a 3D graph showing tuning of RF power using the recipe controlled calibration system of FIG. 5D that shows the effect on a high frequency tuning circuit when adjusting a low to mid frequency tuning circuit, in accordance with one embodiment of the present disclosure.

FIGS. 5D-5F illustrate a recipe controlled calibration circuit 500D configured for calibrating low frequency RF power and/or high frequency RF power, and simulation results showing the power response when adjusting capacitors in the calibration circuit 500D, in one embodiment.

In particular, FIG. 5D illustrates a recipe controlled calibration circuit 500D including series elements for splitting the RF power delivered to multiple stations, in accordance with one embodiment of the present disclosure. Circuit 500D includes node 1 for receiving low frequency RF_IN. Node 1 is coupled to LF inductor 501, which is coupled in parallel to a variable LF capacitor (LF Cap) 502, both of which is coupled to node 2. Node 2 is coupled to low frequency capacitors 503 and 504 in parallel. A parallel circuit includes a low frequency inductor 505, a capacitor 506, capacitor 507, and capacitor 508, all coupled in parallel between node 1 and node 2. Capacitor 516 is coupled between node 1 and node 4 configured for receiving high frequency RF_IN. Variable HF capacitor (HF Cap) 515 is coupled between node 2 and ground. Inductor 517 is coupled between node 1 and node 5, which provides RF_OUT.

Also, FIGS. 5E and 5F show simulations that suggest that the recipe controlled calibration circuit 500D is not fully isolated. In particular, FIG. 5E illustrates a 3D graph showing tuning of RF power using the recipe controlled calibration system of FIG. 5D that shows the effect on a high frequency tuning circuit when adjusting a low frequency tuning circuit, in accordance with one embodiment of the present disclosure. For example, in FIG. 5E, when the low frequency component (e.g., capacitor) of circuit 500D is adjusted, at a certain value for the low frequency capacitor the power will vary depending on the value of the high frequency capacitor. That is, the low frequency and high frequency components influence each other and are not isolated. Similarly, FIG. 5F illustrates a 3D graph showing tuning of RF power using the recipe controlled calibration system of FIG. 5D that shows the effect on a low frequency tuning circuit when adjusting a high frequency tuning circuit, in accordance with one embodiment of the present disclosure. In FIG. 5F, when the high frequency component (e.g., capacitor) of circuit 500D is adjusted, at a certain value for the high frequency capacitor the power will vary depending on the value of the low frequency capacitor. As such, again the low frequency and high frequency components influence each other and are not isolated. As such, the circuit 500A of FIG. 5A provides an improvement over circuit 500D of FIG. 5D, as the low to mid frequency and high frequency components are isolated from each other when operating at their respective frequencies.

Figure 6:
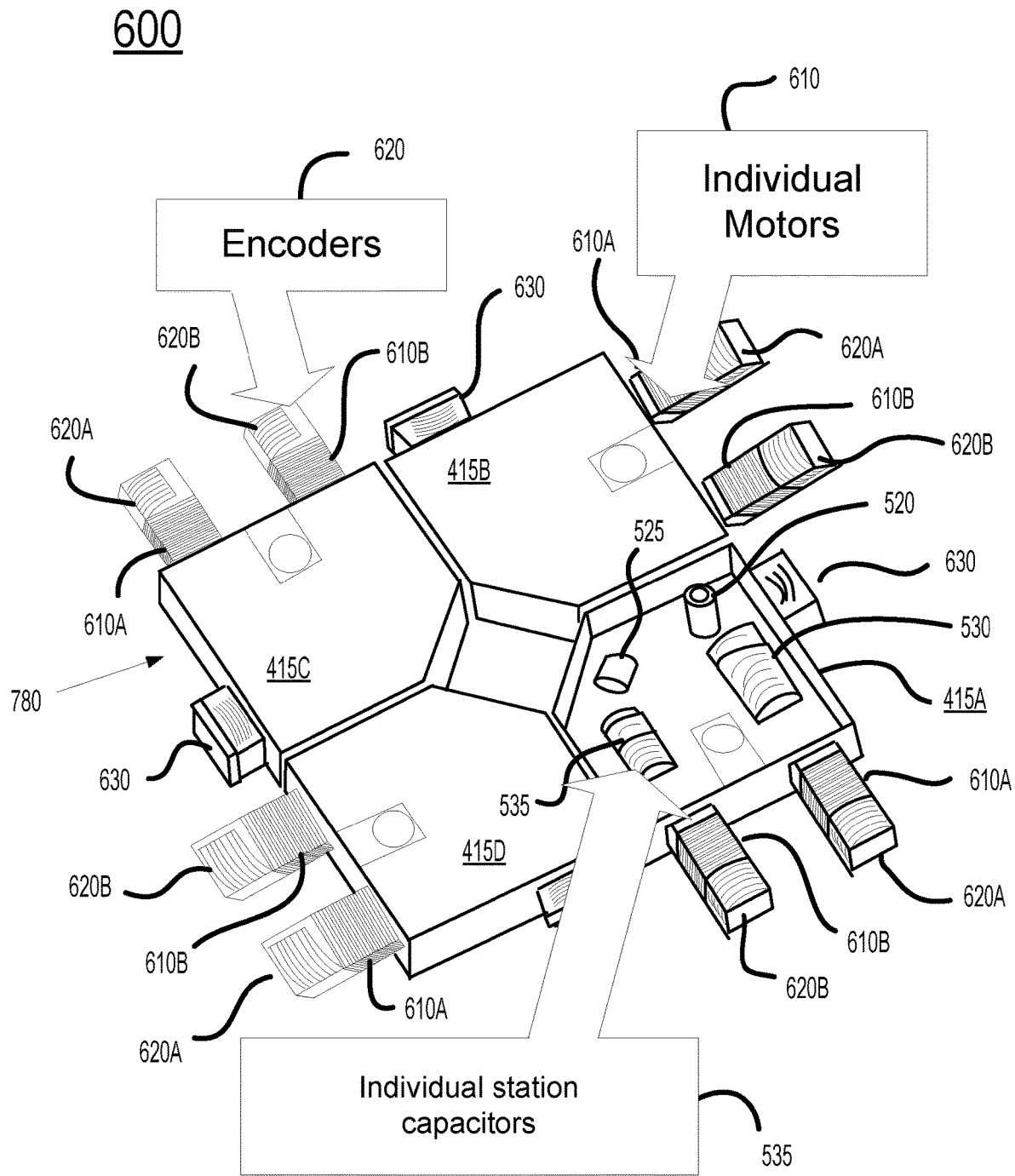
FIG. 6 is a perspective view of a system configured for automatic balancing of the distribution of RF power to multiple stations using one or more MRCC systems, in accordance with one embodiment of the present disclosure.
Figure 7A:
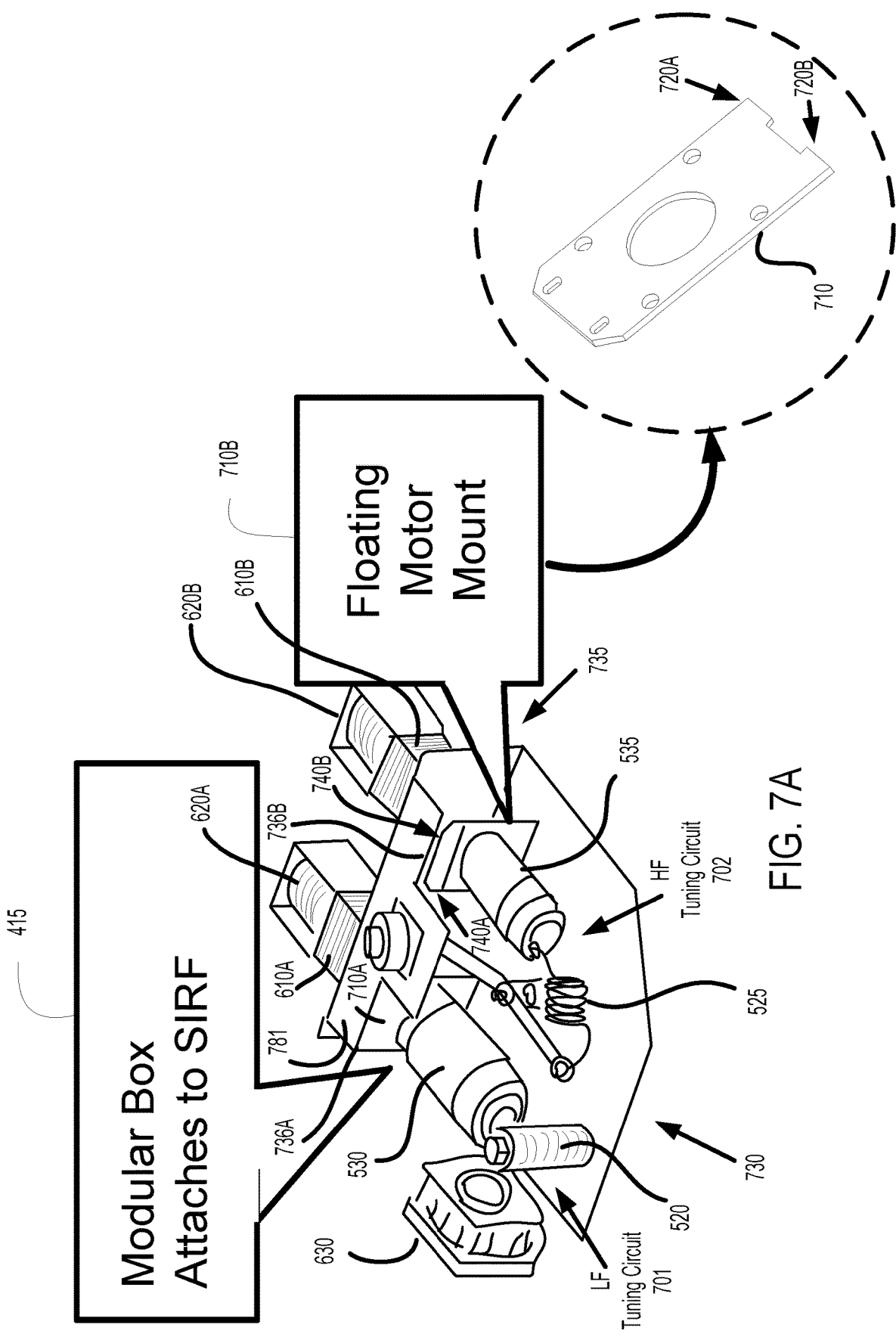
FIG. 7A is a perspective view of an MRCC system configured for tuning of RF power to a processing station, and including a floating motor mount for interfacing with capacitors of a low to mid frequency tuning circuit or a high frequency tuning circuit, in accordance with one embodiment of the present disclosure.

FIG. 6 is a perspective view of a system 600 configured for automatic balancing of the distribution of RF power to multiple stations using one or more MRCC tuning systems, in accordance with one embodiment of the present disclosure. As shown, system 600 includes a quadset of MRCC tuner modules needed to supports a quad station module tool. That is, the quadset includes four individual MRCC tuners, including MRCC tuners 415A-415D, wherein each MRCC tuner is configured to control power delivery to a corresponding station. Each MRCC tuner is similarly configured, and a discussion of MRCC tuner 415A provided below is representative of all the MRCC tuners. In particular, FIG. 7A provides a perspective and open view of an MRCC tuner 415 (e.g., 415A) configured for delivery balanced and/or desired power to a corresponding station.

In one embodiment, system 600 shows a symmetric design that is forward compatible with future symmetric low to mid frequency RF systems, and as such improves inherent station balancing performance. In particular, four MRCC tuning systems 415A-415D are arranged in symmetric fashion around a center opening 690. In one embodiment, the symmetrically arranged MRCC tuning systems 415A-415D are configured below a quad station processing system (e.g., system shown in FIGS. 2-3) to provide power to one or more pedestals. In another embodiment, the symmetrically arranged MRCC tuning systems 415A-415D are configured above a quad station processing system (e.g., system shown in FIGS. 2-3) to provide power to one or more showerheads.

Each MRCC tuner 415 includes an LF/MF tuning circuit 701 and an HF tuning circuit 702, as previously described. For example, the LF/MF tuning circuit includes an LF/MF inductor 520 and an LF/MF capacitor, wherein the LF/MF tuning circuit is tuned by adjusting a corresponding LF/MF capacitor 530. Also, the HF tuning circuit includes an HF inductor 525 and an HF capacitor 535, wherein the HF tuning circuit is tuned by adjusting the HF capacitor 535.

Each of the MRCC tuners are similarly configured. For example, MRCC tuner 415A includes a fan 630 for providing cooling of components within the MRCC tuner. In addition, each tuning circuit in the MRCC tuners 415 includes an actuator 610 configured for adjusting a corresponding variable capacitor, and an encoder 620 for measuring the value of the variable capacitor. The actuator is configured for changing a value of a corresponding capacitor. For example, the actuator may be a motor (e.g., stepper, servo, etc.) controlled to change the value of a variable capacitor. For example, LF/MF tuning circuit 701 is coupled to actuator 610A and encoder 620A. Similarly, HF tuning circuit 702 is coupled to actuator 610B and encoder 620B.

Because of its similar configuration, the MRCC tuners can be employed in modular fashion, wherein one MRCC tuner 415 is associated with one station. Modularity is implemented by providing an MRCC tuner 415 that can be physically separate from but attaches to a pre-existing split input RF (SIRF) distribution box. In particular, each MRCC tuner 415 can be placed close to the reactor or close to the source or anywhere on the path of the RF for that matter. As such, by inserting the MRCC tuner 415 into the RF path, the load is impeded (e.g., changed) to increase or decrease the energy going to a particular station.

In one embodiment, the MRCC tuner 415A uses absolute encoders 620 to track down the position of each corresponding capacitor. Position information may be provided as feedback to a controller. Absolute encoders enable more accurate positioning and positioning verification to ensure repeatable positioning and thus repeatable station to station power adjustment. Previously, encoders were not used for position verification, and as such internal verification of values and positions could not be performed for verification purposes.

Furthermore, when using absolute encoders, position information as determined by a corresponding encoder is not lost. That is, the absolute encoder allows the position to be known through a power cycle without having to reset the position using a homing, limit switch or hard stop find routine. For example, the mechanical end limits and intermediate points of a variable capacitor can be determined and learned by an absolute encoder. This allows for more consistent process results that do not change with a power cycle. Also, the use of absolute encoders does not exert strain on the capacitor, because the corresponding capacitor need only be calibrated once (e.g., to determine its mechanical end limits). As such, the integrated absolute encoders can be configured to track actual position and to ensure motors know where they are with minimal change in capacitance. This eliminates the need for performing high stress homing.

In particular, the use of absolute encoders 620 allows for the ability to create an accurate profile of a corresponding capacitor. The two ends of the capacitor can be found by looking at the motor's perceived position (based on the steps/pulses sent to the motor) and compared to the actual position of the motor (based on the absolute encoder) and determining a hard stop has been found when they are more than a full step out of sync (1.8 degrees), in one embodiment. This determined limit allows less stress on the hard stops by stopping and not "hammering" the hard stops. For example, a stepper motor exerts a semi-sinusoidal force (e.g., back electromotive force [EMF] pulse) once it jams into something, causing a "hammering" motion which can cause more damage if not stopped quickly. Checking for a full step (or less) of misalignment between the motor and encoder allows for the stepper motor to stop only during the first contact with the hard stop. Subsequently, the motor may be preventing from returning to the hard stop when adjusting the capacitor. Repeatedly hitting a hard stop can deleteriously change the function of the capacitor and cause the system recipe to need to be retuned, potentially after every power cycle.

Specifically, finding one hard stop will allow for a coordinate system to be established. The capacitor health can also be checked by finding the other hard stop (e.g., the other end) to ensure full range of tuning for a given capacitor. The perceived number of turns as determined by finding both hard stops can be compared to the expected number of turns as provided by the manufacturer. If the perceived number of turns does not match the expected, it could point to issues with slipping of the capacitor and motor, broken capacitor, incorrect capacitor, etc., in embodiments. Detecting these issues prior to calibration and periodically throughout the life of an MRCC tuner provides preventive maintenance.

Figure 7B:
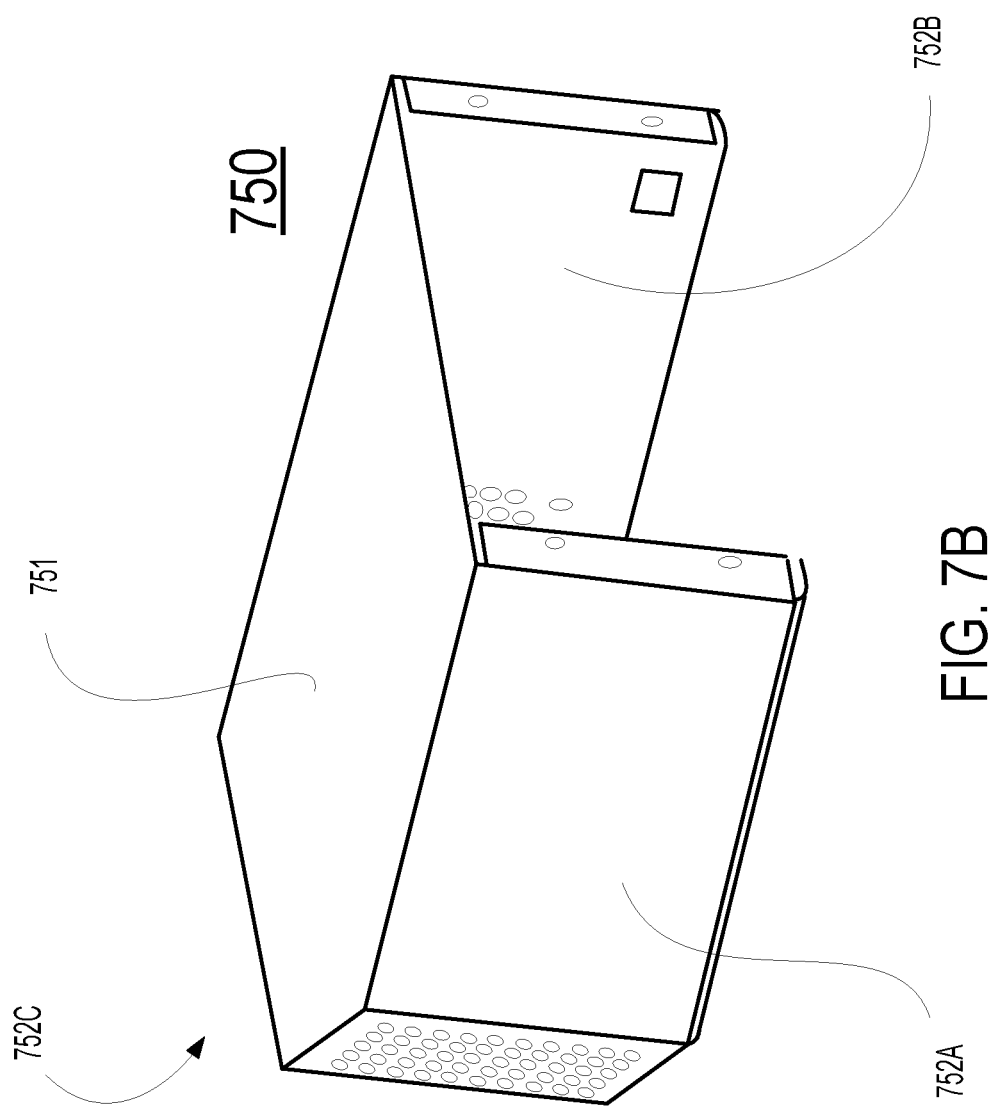
FIG. 7B is a perspective view of a clamshell exterior of an MRCC system configured for tuning of RF power to a processing station, in accordance with one embodiment of the present disclosure.

FIG. 7B is a perspective view of a clamshell exterior 750 of an MRCC tuner 415 configured for tuning of RF power to a processing station, in accordance with one embodiment of the present disclosure. The clamshell enclosure design allows an assembler to gain access through three sides thus reducing assembly time and cost, and making assembly time for the components shorter, thus reducing labor cost. For example, referring to both FIGS. 7A and 7B, the clamshell enclosure 750 is attached to a chassis 730 configured for holding at least the LF/MF tuning circuit 701 and the HF tuning circuit 702. The clamshell enclosure 750 is also attached to a face 735 that acts as an interface between the tuning circuits (e.g., LF/MF tuning circuit 701 and the HF tuning circuit 702) on one side and the motor 610 and encoder 620 on the other side.

More specifically, an enclosure 780 includes the chassis or base 730, a front face 735, and the clamshell exterior 750. The enclosure 780 is configured for enclosing the LF/MF tuning circuit 701 and the HF tuning circuit 702. The clamshell exterior 750 includes a top 751 and a plurality of sidewalls. For example, clamshell exterior 750 includes sidewalls 752A and 752B that are adjacent to the front face 735, and a sidewall 752C that is opposed to the front face 735 when attached. In addition, a bracket 781 is attached or coupled to the front face 735.

As shown in FIG. 7A, the MRCC tuner 415 of FIG. 7A includes one or more floating motor mounts 710 (e.g., mounts 710A and 710B) attached to the face 735 for interfacing with capacitors of the low to mid frequency tuning circuit 701 or the high frequency tuning circuit 702, in accordance with one embodiment of the present disclosure. For example, floating motor mount 710A provides a floating interface between the LF/MF actuator 610A and the LF/MF capacitor 530, and floating motor mount 710B provides a floating interface between HF actuator 610B and HF capacitor 535.

As an illustration, the top of the floating motor mount 710, as represented by floating motor mount 710B, is attached to an extension 736B through screws 740A and 740B. Extension 736B is attached to bracket 781 which is attached to front face 735. As shown in the blow up, the bottom of the floating motor mount 710 (as represented by mount 710B) is loosely aligned with the chassis 730 by inserting tabs 720A and 720B of mount 710 through slots (not shown) in the chassis 730. The floating motor mount 710B is configured to counter axial misalignment between the actuator/motor 610B and a corresponding capacitor (HF capacitor 535). Proper alignment prevents the capacitor from seizing due to axial pressure on the bearings of the capacitor or of a coupler (not shown) joining the capacitor and the motor. In addition, the floating motor mount 710 can replace a machined and solid aluminum block used as a motor mount for aligning the motor and the capacitor, thereby reducing costs and increasing the ease of installation.

The floating motor mount 710A is similarly configured as mount 710B. In particular, floating motor mount 710A is attached to extension 736A through screws. Extension 736A is attached to bracket 781 which is attached to front face 735. The bottom of floating motor mount 710A is loosely aligned with the chassis 730 by inserting tabs through slots in chassis 730. The floating motor mount 710A is configured to counter axial misalignment between the actuator/motor 610A and a corresponding capacitor (LF/MF capacitor 530). Proper alignment prevents the capacitor 530 from seizing due to axial pressure on the bearings of the capacitor or of a coupler (not shown) joining the capacitor and the motor.

Figure 7C:
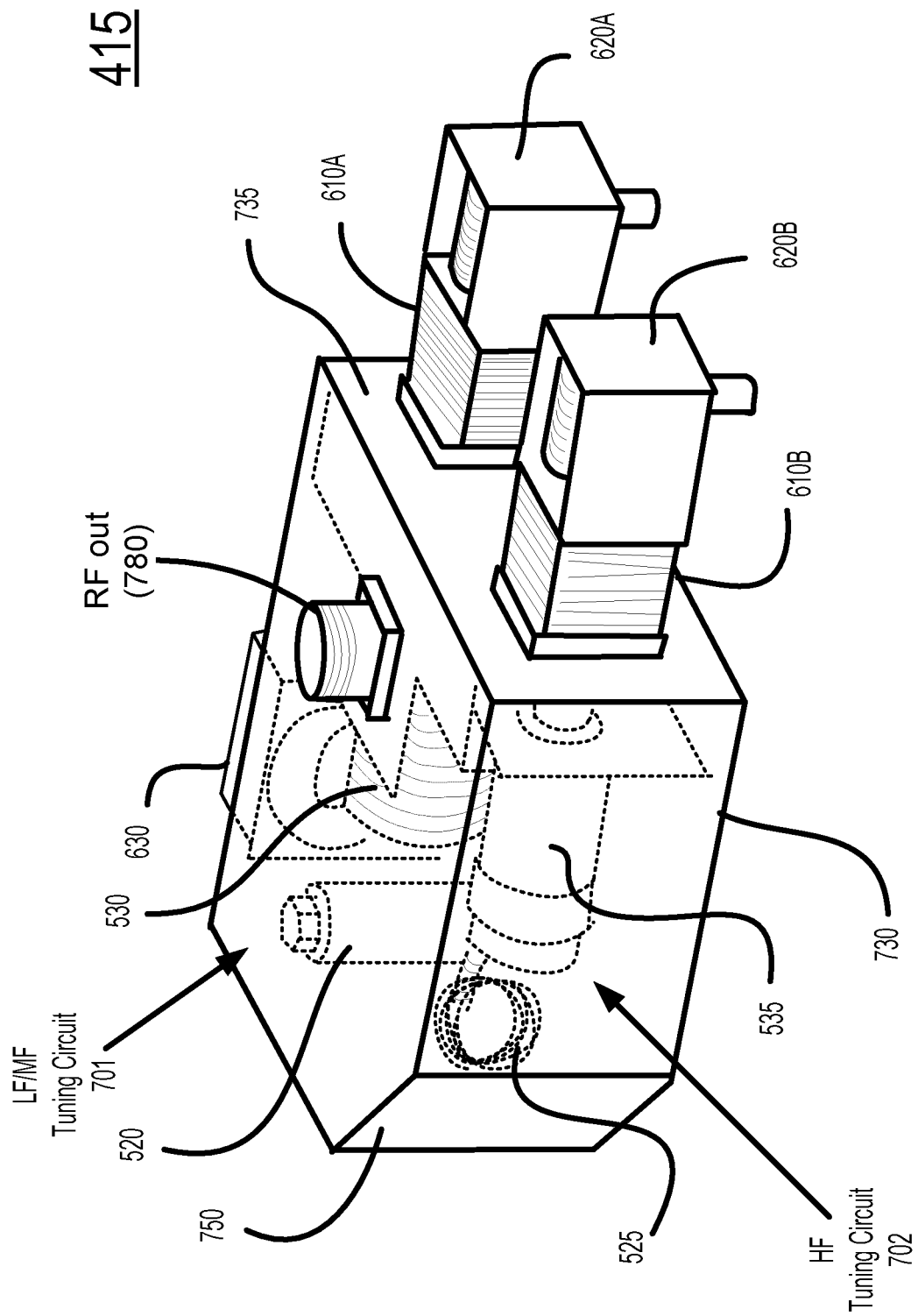
FIG. 7C is a perspective view of an MRCC system configured for tuning of RF power to a processing station illustrating the clamshell exterior of an MRCC system configured for tuning of RF power to a processing station, and the internal components of the MRCC system being enclosed by the clamshell exterior, in accordance with one embodiment of the present disclosure.

FIG. 7C is a perspective view of an MRCC tuner system configured for tuning of RF power to a processing station, in accordance with one embodiment of the present disclosure. The MRCC tuner system includes an LF/MF tuning circuit 701 and an HF tuning circuit 702 mounted to a chassis 730. The clamshell exterior 750 of the MRCC tuner is transparent to show the LF/MF capacitor 530 and the LF/MF inductor 520 of the LF/MF tuning circuit 701, and to show the HF capacitor 535 and the HF inductor 525 of the HF tuning circuit 702. The clamshell exterior 750 is attached to chassis 730 and to the face 735, wherein a fan 630 is also attached to the clamshell exterior 750. The face 735 separates and acts as an interface between the motor 610/encoder 620 and the corresponding tuning circuit, as previously described. The encoders 620 provide position information back to a controller that controls the motor 610 to adjust position of the corresponding capacitor. Also, RF out 780 is shown to delivery RF power to a corresponding station.

Figure 8:
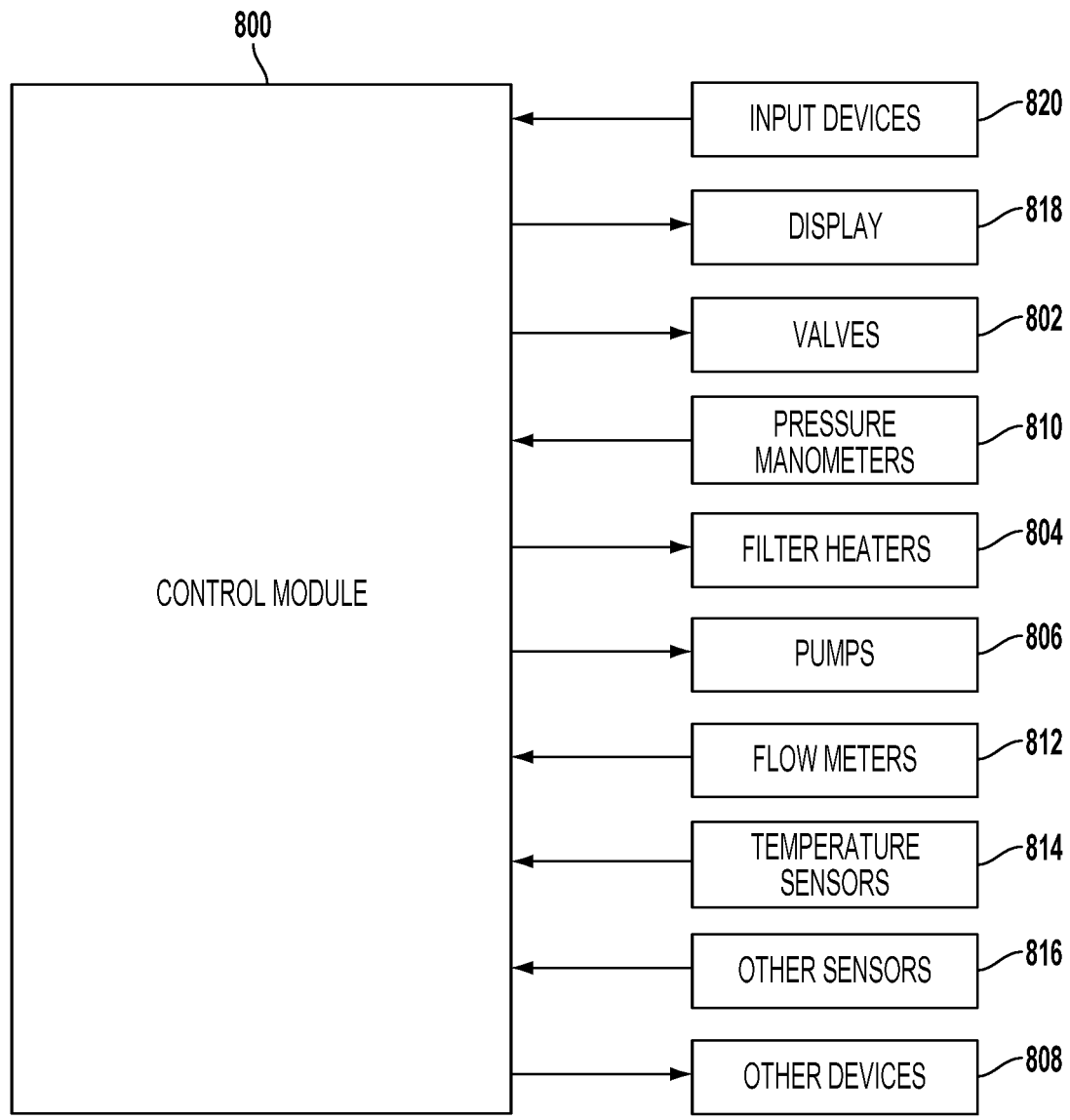
FIG. 8 shows a control module for controlling the systems described above.

FIG. 8 shows a control module 800 for controlling the systems described above. For instance, the control module 800 may include a processor, memory and one or more interfaces. The control module 800 may be employed to control devices in the system based in part on sensed values. For example only, the control module 800 may control one or more of valves 802, filter heaters 804, pumps 806, and other devices 808 based on the sensed values and other control parameters. The control module 800 receives the sensed values from, for example only, pressure manometers 810, flow meters 812, temperature sensors 814, and/or other sensors 816. The control module 800 may also be employed to control process conditions during precursor delivery and deposition of the film. The control module 800 will typically include one or more memory devices and one or more processors.

The control module 800 may control activities of the precursor delivery system and deposition apparatus. The control module 800 executes computer programs including sets of instructions for controlling process timing, delivery system temperature, and pressure differentials across the filters, valve positions, mixture of gases, chamber pressure, chamber temperature, substrate temperature, RF power levels, substrate chuck or pedestal position, and other parameters of a particular process. The control module 800 may also monitor the pressure differential and automatically switch vapor precursor delivery from one or more paths to one or more other paths. Other computer programs stored on memory devices associated with the control module 800 may be employed in some embodiments.

Typically there will be a user interface associated with the control module 800. The user interface may include a display 818 (e.g., a display screen and/or graphical software displays of the apparatus and/or process conditions), and user input devices 820 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low to mid frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include a substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the substrate chuck.

Examples of sensors that may be monitored during deposition include, but are not limited to, mass flow control modules, pressure sensors such as the pressure manometers 810, and thermocouples located in delivery system, the pedestal or chuck, and state sensors 920 in FIGS. 9A-9C. Appropriately programmed feedback and control algorithms may be used with data from these sensors to maintain desired process conditions. The foregoing describes implementation of embodiments of the disclosure in a single or multi-chamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" of all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet.

The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A circuit tuning radio frequency (RF) power, comprising:
    a low frequency (LF) to mid frequency (MF) tuning circuit including a variable low frequency to mid frequency (LF/MF) capacitor coupled in series with an LF/MF inductor, the LF/MF tuning circuit coupled between ground and a common node configured to receive an RF input supplying the RF power that is selectable, wherein in the LF/MF tuning circuit the LF/MF inductor is coupled to the common node and to the variable LF/MF capacitor, wherein in the LF/MF tuning circuit the variable LF/MF capacitor is coupled to the LF/MF inductor and to the ground; and
    a high frequency (HF) tuning circuit coupled in parallel to the LF/MF tuning circuit between the ground and the common node, the HF tuning circuit including a variable HF capacitor coupled in series with an HF inductor, wherein in the HF tuning circuit the HF inductor is coupled to the common node and to the variable HF capacitor, wherein in the HF tuning circuit the variable HF capacitor is coupled to the HF inductor and to the ground,
    wherein cross parallel isolation occurs between the LF/MF inductor of the LF/MF tuning circuit and the HF inductor of the HF tuning circuit when adjusting the variable LF/MF capacitor or the variable HF capacitor,
    wherein the common node is coupled to an output node that is configured to provide an RF output.

2. The circuit of claim 1, wherein the RF power supplied at the RF input is provided by an RF dual source power generator providing at least one of LF/HF power at a low to mid frequency and HF power at a high frequency.

3. The circuit of claim 1, wherein when the RF power supplied at the RF input has a low to mid frequency component, the HF inductor presents a high impedance to the RF input effectively isolating the HF tuning circuit from the LF/MF tuning circuit when adjusting the variable LF/MF capacitor.

4. The circuit of claim 1, wherein when the RF power supplied at the RF input has a high frequency component, the LF/MF inductor presents a high impedance to the RF input effectively isolating the LF/MF tuning circuit from the HF tuning circuit when adjusting the variable HF capacitor.

5. The circuit of claim 1, wherein the output node is configured to provide the RF output to a corresponding processing station after tuning.

6. The circuit of claim 1, further comprising:
    an LF/MF actuator coupled to the variable LF/MF capacitor and configured for adjusting the variable LF/MF capacitor;
    an LF/MF absolute encoder configured for determining a value of the variable LF/MF capacitor;
    an HF actuator coupled to the variable HF capacitor and configured for adjusting the variable HF capacitor; and
    an HF absolute encoder configured for determining a value of the variable HF capacitor.

7. The circuit of claim 1, wherein the LF/MF inductor has a higher value than the HF inductor to provide isolation between the LF/MF tuning circuit and the HF tuning circuit when operating at a low to mid frequency or at a high frequency.

* * * * *